(12) United States Patent
Miyazaki et al.

(10) Patent No.: US 6,850,793 B1
(45) Date of Patent: Feb. 1, 2005

(54) MR IMAGING USING NESTED PULSE SEQUENCE INVOLVING IR PULSE

(75) Inventors: Mitsue Miyazaki, Otawara (JP); Yoshimori Kassai, Otawara (JP)

(73) Assignee: Kabushiki Kaisha Toshiba (JP)

(*) Notice: Subject to any disclaimer, the term of this patent is extended or adjusted under 35 U.S.C. 154(b) by 0 days.

(21) Appl. No.: 09/262,873

(22) Filed: Mar. 2, 1999

Related U.S. Application Data

(62) Division of application No. 08/618,859, filed on Mar. 20, 1996, now Pat. No. 6,023,634.

(30) Foreign Application Priority Data

Mar. 20, 1995 (JP) ............................................... 7-61263
Mar. 19, 1996 (JP) ............................................... 8-62210

(51) Int. Cl.[7] ............................................. A61B 5/055
(52) U.S. Cl. ........................ 600/410; 324/307; 324/309
(58) Field of Search .......................... 600/410; 324/307, 324/309

(56) References Cited

U.S. PATENT DOCUMENTS 5,528,144 A * 6/1996 Gullapalli et al. .......... 324/306
6,320,377 B1 * 11/2001 Miyazaki et al. .......... 324/306

* cited by examiner

Primary Examiner—Ruth S. Smith
(74) Attorney, Agent, or Firm—Gray Cary Ware & Freidenrich LLP

(57) ABSTRACT

In addition to the known MT (magnetization transfer) effect, an RMT (reverse MT) is newly found, which increases a detected MR signal strength. Both the MT and RMT effects can be explained with mutual interaction, such as phenomena of chemical exchange and/or cross relaxation, acted between a pool of water proton spins and another pool of macromolecule proton spins, for example, within an object. In order to enhance the MT or RMT effect, the frequency bandwidths of RF pulses, such as a 90° RF exciting pulse in a SE or FSE method, an inversion pulse in a FLAIR or fast FLAIR method, and others, are controlled. To enhance the MT effect, the bandwidth is controlled into a wider value (approx. more than 1250 Hz) than the normally (conventionally) used bandwidth, while to obtain the RMT effect, the bandwidth is controlled into a narrower value (approx. less than 1000 Hz) than the normally used bandwidth. Actively controlling the MT or RMT effect permits changed image contrast in MR imaging.

10 Claims, 23 Drawing Sheets

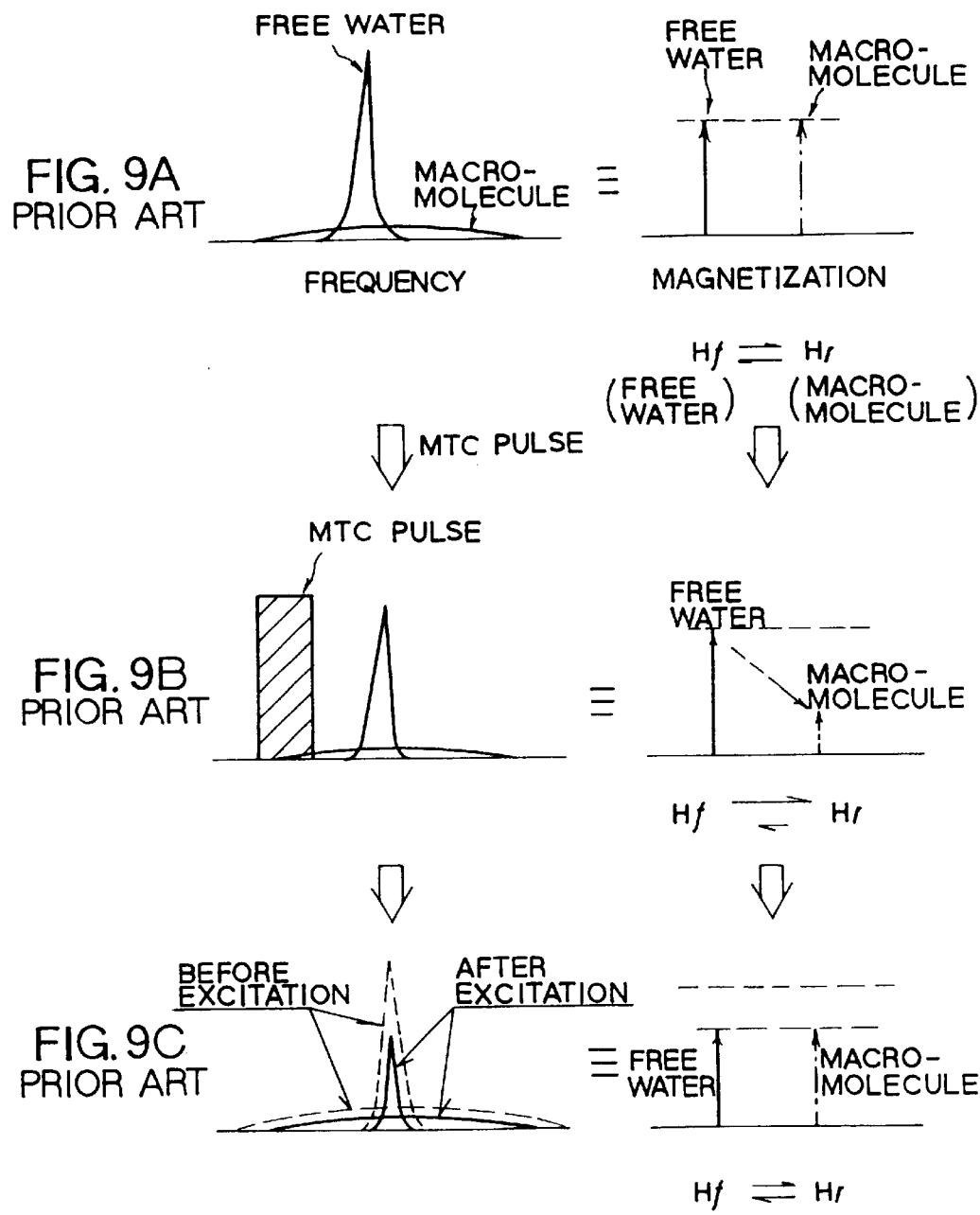

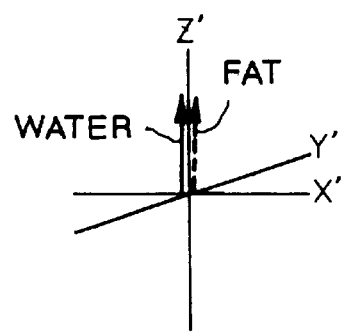
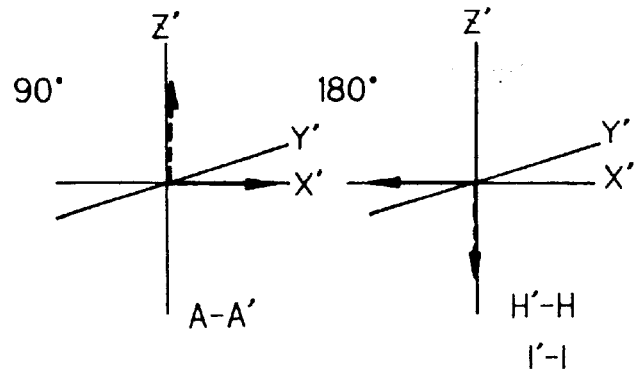
FIG. 25A   FIG. 25B   FIG. 25C
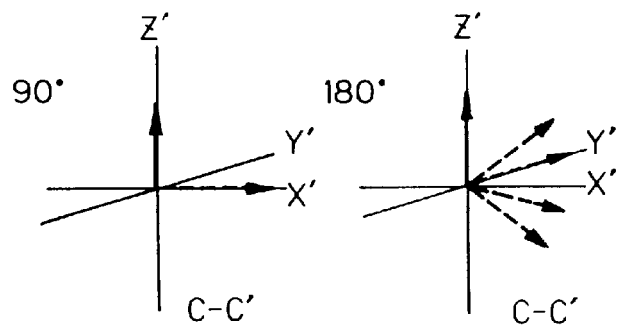
FIG. 25D   FIG. 25E

| NS | Offset | TrWait | TiWait |
|----|--------|--------|--------|
| 3  | 1      | xxxxx  | xxxxx  |
| 7  | 2      | xxxxx  | xxxxx  |
| 10 | 3      | xxxxx  | xxxxx  |
| 14 | 4      | xxxxx  | xxxxx  |
| 17 | 5      | 112.9412 | 102.6471 |
| 21 | 6      | xxxxx  | xxxxx  |
| 25 | 7      | 0      | 65     |

MR IMAGING USING NESTED PULSE SEQUENCE INVOLVING IR PULSE

This is a divisional application of Application No. 08/618,859, filed on Mar. 20, 1996 now U.S. Pat. No. 6,023,634 issued on Feb. 8, 2000.

BACKGROUND OF THE INVENTION

1. Field of the Invention

The present invention relates to a magnetic resonance imaging based on magnetic resonance phenomena exhibited by spins of nuclei. More particularly, this invention is concerned with medical-purpose magnetic resonance imaging method and magnetic resonance imaging system for executing imaging that uses mutual interaction between different kinds of pools of nuclear spins.

2. Description of the Related Art

Currently, a technique in which a "magnetization transfer" (MT) effect (or "magnetization transfer contrast" (MTC) effect) is utilized to produce a contrast image whose contrast resolution varies depending on whether a living body exerts the MT effect is known as one of various medical resonance imaging techniques. A practical example of this imaging technique has been disclosed in U.S. Pat. No. 5,050,609 ("Magnetization Transfer Contrast and Proton Relaxation and Use Thereof in Magnetic Resonance Imaging" filed by Robert S. Balanban et al.).

The MT effect originates from a saturation transfer (hereinafter ST) technique proposed by Forsen and Hoffman (Refer to the Journal of Chemical Physics, Vol.39 (11), pp.2892–2901 (1963) written by Forsen et al.), and is based on chemical exchange and/or cross relaxation between protons of a plurality of kinds of pools of nuclei, for example, free water and a macromolecule.

The relationship involving magnetic resonance between the protons of free water and those of a macromolecule is such that free water having a long transverse relaxation time T2 (T2=approx. 100 msec.) and the macromolecule having a short relaxation time T2 (T2=approx. 0.1 to 0.2 msec.) become resonant with the same frequency. The relationship involving frequency spectra between the free water and the macromolecule is shown on the lefthand column of FIG. 9A. The exchange and relaxation of magnetizations between them is shown on the right-hand column of FIG. 9A (the same applies to FIGS. 9B and 9C). As for a signal induced by the free water, since the free water has a long relaxation time T2, a signal subjected to Fourier transformation is, as illustrated, expressed as a wave having a sharp peak and a small half-width. By contrast, as for a signal induced by protons of a macromolecule such as protein whose relative motions are restricted, since the macromolecule has a short relaxation time T2, a signal subjected to Fourier transformation is expressed as a wave having a large half-width but not having a peak in the frequency spectrum.

In the known imaging method based on the MT effect, when the peak resonant frequency of the free water signal is regarded as a center frequency, as shown in FIG. 9B, a frequency-selective pre-pulse (MTC pulse) is used to excite the component of the free water having a frequency shifted by, for example, 500 Hz from the resonant frequency of the free water (off-resonance excitation). This causes the magnetization $H_f$ of the free water to transfer to the magnetization $H_r$ of a macromolecule. Consequently, as shown in FIG. 9C, the level of an MR signal induced by protons of the macromolecule is lowered, and the level of an MR signal induced by protons of the, free water is lowered at a higher rate. This means that there is a difference in signal level between a region on which chemical exchange and/or cross relaxation between free water and a macromolecule is reflected and a region on which the chemical exchange and/or cross relaxation is not reflected. Contrast images of different contrast resolutions can therefore be produced. This is usable in differentiating a lesion in a living body or the like from a normal tissue therein.

The known MT effect is based on a so-called "negative" transfer of a magnetization in which the magnetization $H_f$ of protons of free water is transferred to the magnetization $H_r$ of protons of a macromolecule through off-resonance excitation in order to lower an MR signal induced by the free water. As a result, the signal-to-noise ratio of the signal is low.

The foregoing MT effect results from an interaction between spins of a plurality of different pools of nuclei. Even imaging, which has been unconscious of any particular influence of the MT effect in the past, undergoes the influence of the MT effect in reality.

In particular, for example, in a fluid-attenuated inversion-recovery (FLAIR) or fast FLAIR, numerous applied inversion pulses (for example, 180° RF pulses) bring about the MT effect relative to adjoining slices. This leads to a decrease in signal strength. Moreover, since such imaging techniques do not take account of the MT effect and an interpulse time between applied inversion pulses is often not uniform, irregular sensitivity occurs between slices due to the MT effect.

Further, a plurality of 180° refocusing pulses employed in fast spin echo (FSE) imaging to be implemented in fast FLAIR imaging trigger the MT effect. This presumably deteriorates the contrast between, for example, white matter and gray matter.

Conversely, causing the MT effect can change image contrast. However, in imaging employing an IR-(inversion recovery) system pulse sequence, imaging techniques making use of the MT effect have not yet been developed.

SUMMARY OF THE INVENTION

Accordingly, an object of the present invention is to provide a method of acquiring an MR signal with a high signal-to-noise ratio, a magnetic resonance imaging method, and a magnetic resonance imaging system, in which the level of an MR signal induced by a pool of nuclei such as free water can be raised and a "positive" MTC effect can be yielded.

An object of the present invention is to enable magnetic resonance imaging which employs an IR pulse sequence including an inversion pulse and in which the phenomenon of chemical exchange and/or cross relaxation between a plurality of kinds of pools of nuclei, such as in the MT effect, is utilized actively.

Another object of the present invention is to enable magnetic resonance imaging which employs an IR pulse sequence and in which the phenomenon of chemical exchange and/or cross relaxation between a plurality of kinds of pools of nuclei is used to produce an MR image with improved contrast between, for example, white matter and gray matter.

Yet another object of the present invention is to enable magnetic resonance imaging which employs an IR pulse sequence and in which the phenomenon of chemical exchange and/or cross relaxation between a plurality of kinds of pools of nuclei is used to improve a signal-to-noise ratio and eventually produce an MR image with improved efficiency of rendering, for example, the cranial nervous tissue.

Still another object of the present invention is to enable multislice-system magnetic resonance imaging which employs an IR pulse sequence including an inversion sequence and FSE pulse sequence and in which irregular sensitivity between slices is minimized by reducing and averaging the influence of the phenomenon of chemical exchange and/or cross relaxation between a plurality of kinds of pools of nuclei upon a plurality of slices.

Still another object of the present invention is to enable multislice-system magnetic resonance imaging which employs an IR pulse sequence including an inversion sequence and FSE pulse sequence and in which irregular sensitivity between slices can be minimized by reducing and averaging the influence of the phenomenon of chemical exchange and/or cross relaxation between a plurality of kinds of pools of nuclei upon a plurality of slices, a repetition time TR and inversion time TI can be set readily in a user-specific manner, and the largest possible number of slices can be ensured.

Still another object of the present invention is to enable magnetic resonance imaging which employs an IR pulse sequence and in which a repetition time TR and inversion time TI are shortened.

Still another object of the present invention is to enable magnetic resonance imaging which employs an IR pulse sequence and in which the contrast level of a T1-weighted image is further improved.

Still another object of the present invention is to enable imaging which employs an IR pulse sequence and in which one or a plurality of the foregoing objects are accomplished and so-called fat suppression for suppressing an MR signal induced by fat can be performed concurrently.

In addition to the known MT (magnetization transfer) effect, an RMT (reverse MT) is newly found, which increases a detected MR signal strength. Both the MT and RMT effects can be explained by mutual interaction, such as the phenomena of chemical exchange and/or cross relaxation, acting between a pool of water proton spins and another pool of macromolecule proton spins, for example, within an object. In order to enhance the MT or RMT effect, the frequency bandwidths of RF pulses, such as a 90° RF exciting pulse in a SE or FSE method, an inversion pulse in a FLAIR or fast FLAIR method, and others, are controlled. To enhance the MT effect, the bandwidth is controlled at a wider value (approx. more than 1250 Hz) than the normally (conventionally) used bandwidth, while to obtain the RMT effect, the bandwidth is controlled at a narrower value (approx. less than 1000 Hz) than the normally used bandwidth. Actively controlling the MT or RMT effect permits changed image contrast in MR imaging.

In order to accomplish the above object, the method of acquiring an MR signal in accordance with the present invention acquires MR signals stemming from magnetic resonance phenomena exhibited by at least two kinds of pools of nuclei in a patient body which have a coupled relationship deriving from at least one of the phenomena of chemical exchange and cross relaxation. The method of acquiring an MR signal comprises a step of exciting a specified pool of nuclei of the at least two kinds of pools of nuclei by means of a radio-frequency (hereinafter RF) pulse whose frequency bandwidth substantially agrees with the bandwidth in frequency spectrum of the specified pool of nuclei, and a step of acquiring an MR signal, which is induced by the specified pool of nuclei and which reflects the at least one of the phenomena, after the excitation.

In a signal acquisition method or an imaging system in accordance with the present invention, a specified pool of nuclei (for example, protons of free water) is excited on a frequency-selective basis by means of an RF pulse that is set to a narrow frequency band; that is, the substantially same bandwidth as the frequency band of the specified nuclear pool. With this excitation, the magnetized spins of another pool of nuclei (for example, protons of a macromolecule) having a chemically-coupled relationship with the pool of nuclei are hardly saturated (held unsaturated to the greatest extent), but the magnetized spins of the specified pool of nuclei are fully saturated. After excitation by a narrow-band selective excitation pulse (of a narrow frequency band of, for example, 800 Hz), the magnetization of another pool of nuclei is transferred to the magnetization of the specified pool of nuclei due to chemicalexchange and/or cross relaxation. Consequently, the level of the MR signal induced by the pool of nuclei such as free water having a large transverse relaxation time T2 is raised. Eventually,. the signal-to-noise ratio of the MR signal induced by the specified pool of nuclei increases.

The above effect works to raise the level of the MR signal induced by the specified pool of nuclei such as protons of free water.

In contrast with the known "negative" MT effect that lowers an MR signal, this effect can be referred to as a "positive" MT effect. The present inventor calls the "positive" MT effect a "reverse" MT effect.

When the "reverse" MT effect is used to perform magnetic resonance imaging or ST-based spectroscopy, since the level of an MR signal gets higher, the resolution of a contrast image can be upgraded. Moreover, the analytic capability of spectroscopy can be improved.

According to another aspect of the present invention, provided is a method of magnetic resonance imaging comprising the steps of: specifying a frequency bandwidth of an RF pulse to be applied to an object, the frequency bandwidth being a value which substantially controls generation of either one of a chemical exchange phenomenon and a cross relaxation phenomenon between a plurality of different pools of nuclear spins residing within the object; and applying the RF pulse to the object in a predetermined pulse sequence to acquire an MR signal from the object.

Another aspect of the present invention is a method of magnetic resonance imaging first applying to an object to be imaged which is placed in a static magnetic field an inversion sequence for inversion recovery of proton spins residing within the object, the inversion sequence including an inversion pulse having a frequency bandwidth, and then applying to the object an imaging sequence for acquiring a magnetic resonance signal from the object, wherein the inversion pulse is changed from the frequency bandwidth of a normally used inversion pulse.

The frequency bandwidth of the normally used inversion pulse is within a range of approximately 1000 to 1250 Hz. Preferably, the inversion pulse is wider in frequency bandwidth than the normally used inversion pulse or the inversion pulse is narrower in frequency bandwidth than the normally used inversion pulse.

Preferably, the imaging sequence is a pulse sequence acquiring an echo signal. For example, the pulse sequence is a fast spin echo pulse sequence. The fast spin echo pulse sequence has a plurality of RF refocusing pulses each of which provides the spin a flip angle smaller than 180°.

Further, another aspect of the invention is concerned with a method of magnetic resonance imaging first applying to an object to be imaged which is placed in a static magnetic field an inversion sequence for inversion recovery of proton spins residing within the object, the inversion sequence including an inversion pulse, and then applying to the object an imaging sequence for acquiring a magnetic resonance signal from the object, wherein a flip angle provided by the inversion pulse to the spins is smaller than 180°.

Still further, there is provided a method of magnetic resonance imaging using a pulse sequence of an IR system including inversion sequences each including an inversion pulse and each being applied to each of a plurality of slice planes of an object to be imaged which is placed in a static magnetic field and imaging sequences each applied to each of the plurality of slice planes after an inversion time has passed from each of the corresponding inversion sequences in a repetition time, the method comprising the steps of: manually providing both the repetition time and the inversion time; setting the IR-system pulse sequence according to the specified repetition time and inversion time in a manner such that during the one inversion time formed between the inversion sequence and the imaging sequence both applied to each of the plurality of slice planes, not only the inversion sequence applied to at least one of the remaining slice planes but also the imaging sequence applied to at least another one of the remaining slice planes is allocated, and intervals of magnetic influence on nuclear spins residing within each of the plurality of slice planes and being given by the plurality of inversion sequences and the plurality of imaging sequences are mode equal in time to each other in repetition time using two kinds of waiting time parameters; and performing a multislice scan for the plurality of slice planes based on the set IR-system pulse sequence.

It is preferred that the two kinds of waiting time parameters are parameters of waiting time periods placed before and after each of the plurality of imaging sequences, respectively.

BRIEF DESCRIPTION OF THE DRAWINGS

In the accompanying drawings:

FIGS. 9A to 9C are diagrams for explaining a known MT effect in conjunction with magnetized states;

FIGS. 25A to 25E are diagrams for explaining the behaviors of spins of protons of water and of those of fat in PASTA;

DETAILED DESCRIPTION OF THE PREFERRED EMBODIMENTS

The first embodiment of the present invention will be described with reference to FIGS. 1 to 7.

Figure 1:
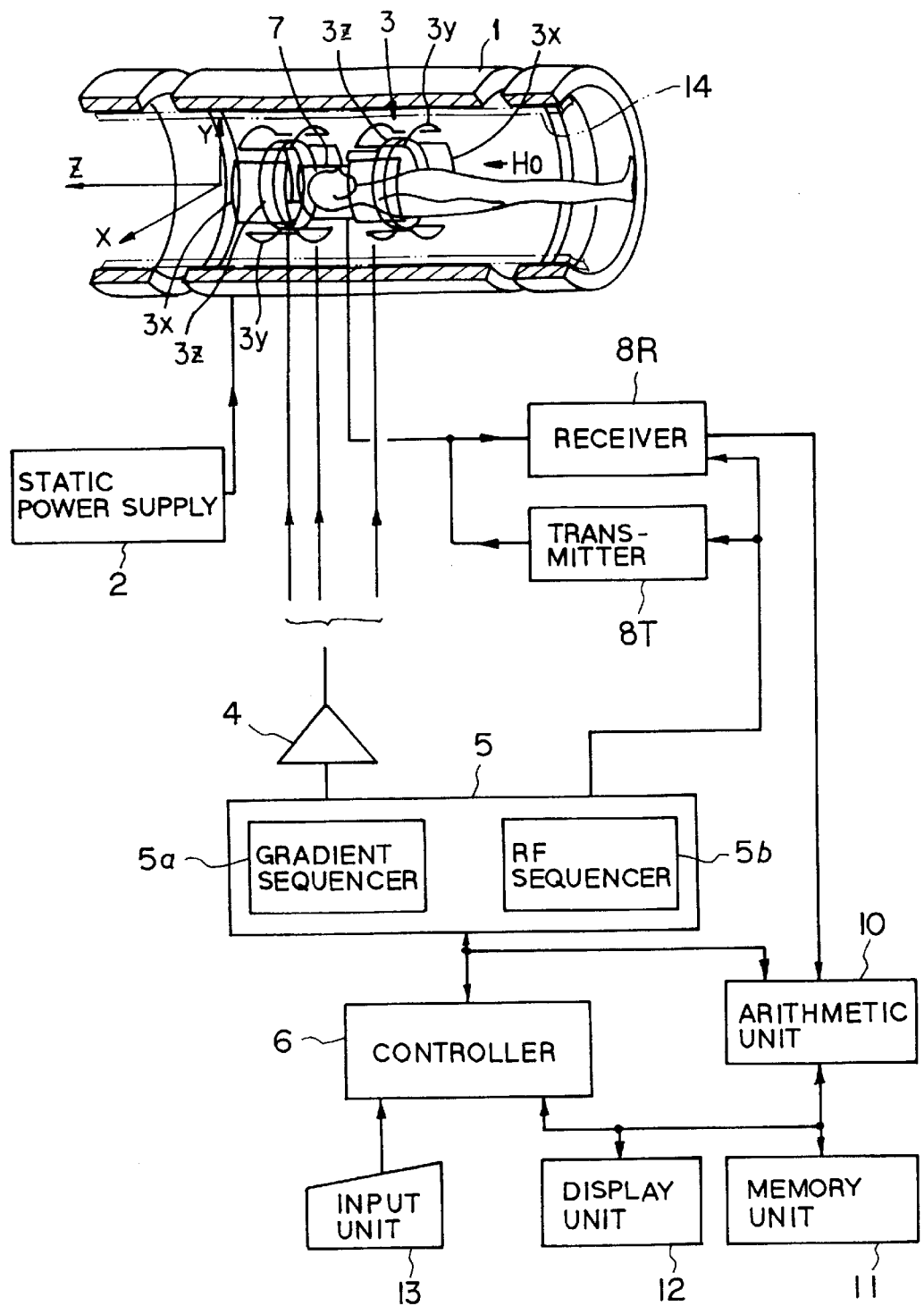
FIG. 1 is a schematic block diagram of a magnetic resonance imaging system in accordance with an embodiment of the present invention.

FIG. 1 shows an outline configuration of a magnetic resonance imaging system in accordance with this embodiment. This magnetic resonance imaging system comprises a magnet unit for generating a static magnetic field, a magnetic field gradient unit for appending position information to a static magnetic field, a transmitting and receiving unit for receiving an MR signal, and a control and arithmetic unit responsible for system control and image reconstruction.

The magnet unit comprises a superconducting magnet 1 and a static power supply 2 for supplying a current to the magnet 1, and generates a static magnetic field $H_0$ in a Z-axis direction in a cylindrical aperture into which a patient P is inserted. The magnet unit is provided with shim coils 14 for primary shimming. By regulating a current to be supplied to the shim coils 14, shimming is achieved.

The magnetic field gradient unit includes three pairs of gradient coils 3x to 3z incorporated in the magnet 1 and designed for producing magnetic field gradients that change in strength in X-axis, Y-axis, and Z-axis directions, respectively, a gradient power supply 4 for supplying a current to the gradient coils 3x to 3z, and a gradient sequencer 5a included in a sequencer 5 for controlling the power supply 4. The gradient sequencer 5a includes a computer and receives a signal commanding a pulse sequence used for acquisition in gradient field echo (hereinafter FE), spin echo (hereinafter SE), fast FE, or fast SE imaging from a controller 6 (including a computer) for controlling the whole system. The gradient sequencer 5a thus controls the imposition of magnetic field gradients that change in the X-axis, Y-axis, and Z-axis directions and the strengths thereof according to a commanded pulse sequence. The magnetic field gradients are therefore superposed on the static magnetic field $H_0$. In this embodiment, the magnetic field gradient changing in the Z-axis direction of three orthogonal axial directions is regarded as a slice-selective magnetic field gradient $G_S$, the magnetic field gradient changing in the X-axis direction is regarded as a readout magnetic field gradient $G_R$, and the magnetic field gradient changing in the Y-axis direction is regarded as a phase-encoding magnetic field gradient $G_E$.

The transmitting and receiving unit includes an RF coil 7 situated in the vicinity of the patient P in the scan space inside the magnet 1, a transmitter 8T and receiver 8R connected to the coil 7, and an RF sequencer 5b (including a computer) incorporated in the sequencer 5 and designed for controlling the transmitter 8T and receiver 8R. The transmitter 8T and receiver 8R supply a pre-pulse or an RF current pulse with a Larmor frequency, which is used to excite nuclear magnetic resonance (hereinafter NMR), under the control of the RF sequencer 5b, receive an MR signal (RF signal) received by the RF coil 7, perform various kinds of signal processing, and thus produce a corresponding digital signal.

Furthermore, the control and arithmetic unit includes the aforesaid controller 6 as well as an arithmetic unit 10 for inputting digital data of the MR signal produced by the receiver 8R and computing image data, a memory unit 11 for storing computed image data, a display unit 12 for displaying an image, and an input unit 13. More particularly, the arithmetic unit 10 maps measured data into a two-dimensional Fourier space that is a memory space and performs Fourier transformations for image reconstruction. The controller 6 synchronizes the gradient sequencer 5a and RF sequencer 5b and controls the contents of their operations and their timing of operation.

Next, the operations of the first embodiment will be described.

Figure 2:
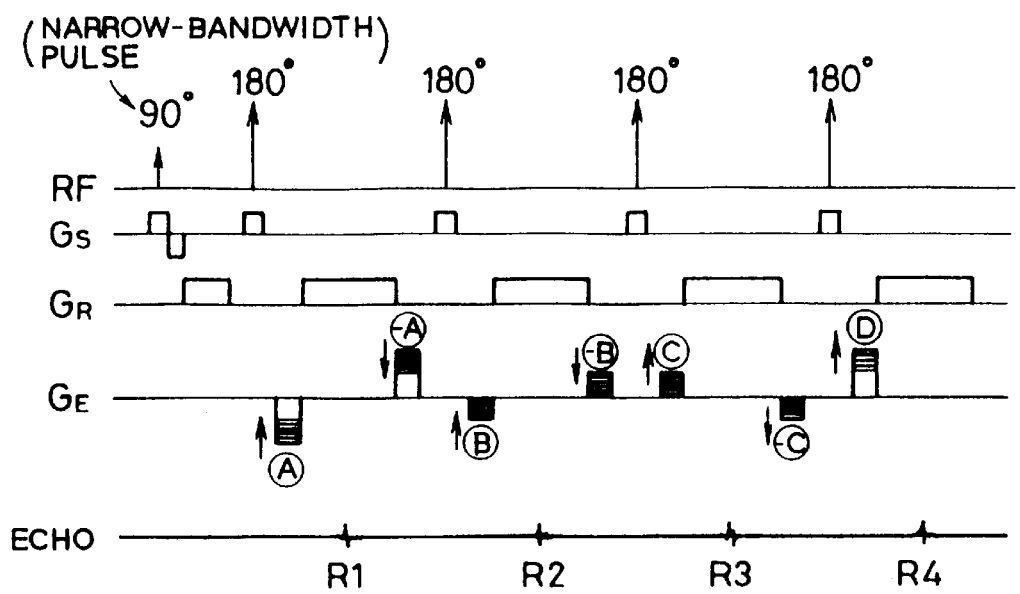
FIG. 2 shows a pulse sequence employed in fast spin echo (FSE) imaging to be executed in the first embodiment.
Figure 3:
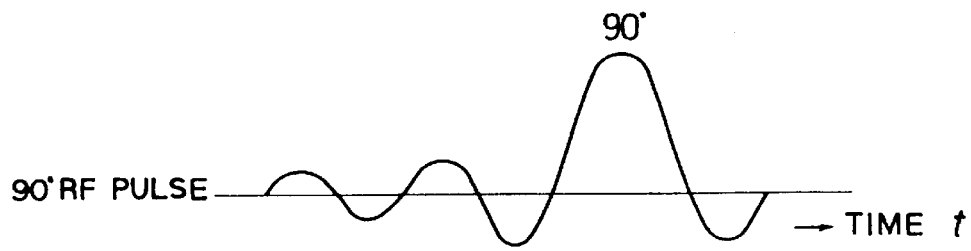
FIG. 3 shows a waveform of a narrow-bandwidth 90° RF pulse.

When the magnetic resonance imaging system is activated, the controller 6 executes a given main program and commands the gradient sequencer 5a and RF sequencer 5b to start such a pulse sequence, for example, as the one shown in FIG. 2 for fast SE imaging. The gradient sequencer 5a controls the slice-selective magnetic field gradient $G_S$, readout magnetic field gradient $G_R$, and phase-encoding magnetic field gradient $G_E$ according to the sequence shown in FIG. 2. In the meantime, the RF sequencer 5b applies a 90° RF pulse and 180° RF pulse to the patient P according to the pulse sequence shown in FIG. 2.

The 90° RF pulse to be applied in this embodiment is expressed by a sinc function containing an increased multiplier of pi ($\pi$) and having long side lobes, and has a long pulse duration. The pulse duration of the 90° RF pulse is set so that the range of the 90° RF pulse used for excitation will substantially agree with the bandwidth in the frequency spectrum of an object pool of nuclei in a patient body.

Figure 4:
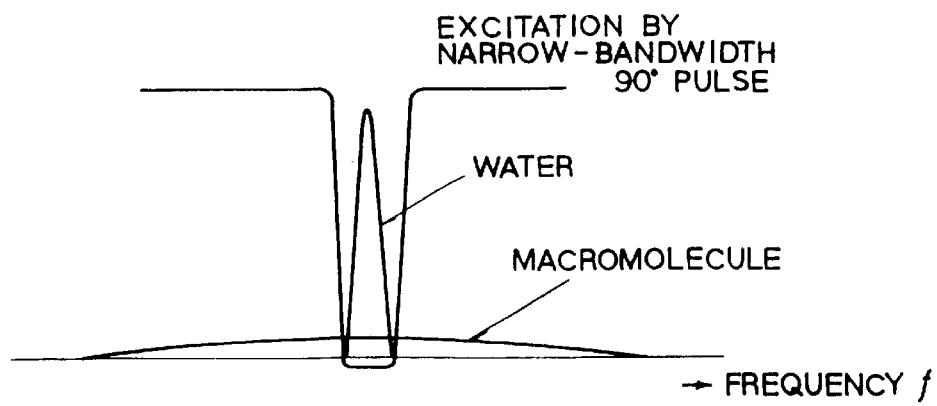
FIG. 4 is a diagram for explaining the bandwidth of a narrow-band 90° RF pulse for excitation.

Assume that one of two kinds of pools of nuclei that have a coupled relationship of chemical exchange and/or cross relaxation includes protons of free water, and the other pool of nuclei includes protons of a macromolecule. The protons of free water shall be regarded as an object pool of nuclei. In this case, the multiplier of lobes determining a 90° RF pulse is set to, for example, preferably, −4 and +1, and the pulse duration is 22 msec. As a result, the excitation bandwidth of the 90° RF pulse becomes 227 Hz. As shown in FIG. 4, the bandwidth is a narrow band substantially agreeing with the bandwidth in the frequency spectrum of free water. For example, when the multiplier of lobes equals ±2 and the pulse duration is 15 msec., the excited bandwidth becomes a narrow band of 267 Hz. According to computation, a pulse having a duration of ±2$\pi$(2 msec) is set to a "wideband" of 2000 Hz. In case of a known exciting RF pulse used for a normal pulse sequence, a pulse having a short duration of ±1$\pi$(2 msec.) is set to a bandwidth of 1000 Hz.

The pulse sequence used for fast SE imaging in this embodiment is characterized in that a 90° RF pulse set to, as mentioned above, a narrow band is employed.

Returning to FIG. 2, the pulse sequence will be described. First, a slice-selective magnetic field gradient $G_S$ is imposed by the gradient power supply 4 via the gradient coils 3z. When the magnetic field gradient $G_S$ rises to a certain value, one narrow-band 90° RF pulse is applied by the transmitter 8T via the RF coil 7. A region of a patient with a given slice width is then selected. At the same time, the spins of protons of free water on the plane are excited on a frequency-selective basis, and flip onto a y' axis (axis of rotation). At this time, the 90° RF pulse fully excites the free water alone on a frequency-selective basis. Since the bandwidth of the 90° RF pulse is as narrow as shown in FIG. 4, the spins of protons of a macromolecule to be excited are limited to those with frequencies in a very narrow frequency band. In other words, the spins of protons of a macromolecule are hardly excited (saturated) by the above narrow-band 90° RF pulse.

Figure 5A:
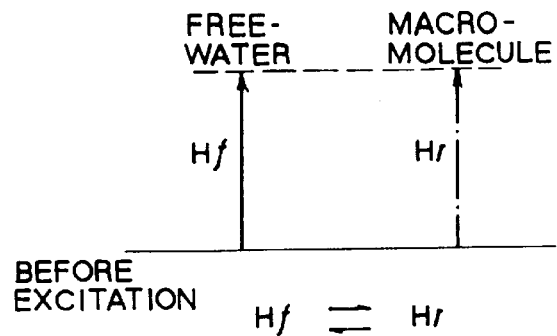
FIGS. 5A and 5B are diagrams for explaining magnetized states attained before and after excitation in relation to the "reverse" MT effect.
Figure 5B:
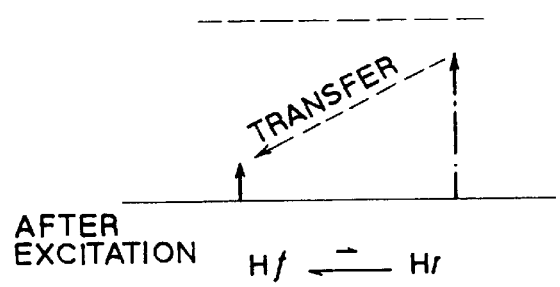

Before being excited, the magnetization $H_f$ of the spins of protons of free water and the magnetization $H_r$ of the spins of protons of a macromolecule keep having a chemically-coupled relationship as shown in FIG. 5A and stay in an equilibrium state. After being excited, as shown in FIG. 5B, a magnetization transfer occurs from the magnetization $H_r$ of the macromolecule that is not excited (saturated) into the magnetization $H_f$ of the free water that is fully excited (saturated).

According to the pulse sequence, the slice-selective magnetic field gradient $G_S$ is inverted and the readout magnetic field gradient $G_R$ is imposed via the gradient coils 3x. This imposition is intended to align in phase the spins oriented in the direction of the magnetic field gradient $G_R$ on the slice plane at times coincident with the centers of the echoes.

A first 180° RF pulse is then applied with the imposition of a slice-selective magnetic field gradient $G_S$. The 180° RF pulse is set to a normal wideband pulse. This causes the spins of the protons of free water to rotate 180° about the y' axis. Moreover, a first phase-encoding magnetic field gradient $G_E$ (=A) is imposed onto the patient P by the gradient power supply 4 via the gradient coils 3y. Thereafter, a first spin echo R1 is acquired via the RF coil 7 with the imposition of a readout magnetic field gradient $G_R$ via the gradient coils 3x.

Thereafter, an inverted phase-encoding magnetic field gradient $G_E$ (=−A) is imposed. This is intended to bring an encoding position back to a center position (ke=0) in a direction of phase encoding in a k-space on the application of a 180° RF pulse in an effort to avoid deterioration of image quality due to stimulated echoes.

A second 180° RF pulse is then applied with the imposition of a slice-selective magnetic field gradient $G_S$, and then a second phase-encoding magnetic field gradient $G_E$ (=B) is imposed. With the imposition of a readout magnetic field gradient $G_R$, a second spin echo R2 is acquired via the RF coil 7.

Likewise, third and fourth spin echoes R3 and R4 are acquired.

The acquisition of the four echoes R1 to R4 is repeated on every RF excitation by a given number of narrow-band 90° RF pulses.

Thus-acquired echoes are consecutively sent to the receiver 8R. After being amplified and subjected to intermediate-frequency transformation, phase detection, and low-frequency amplification, the echoes are converted into a digital form. Echo data is thus produced. The echo data is mapped into a memory area corresponding to k-space enabling Fourier transformation by the arithmetic unit 10. Two-dimensional Fourier transformation is then performed to reconstruct an image in real space. This image is stored in the memory unit 11 and displayed on the display unit 12.

The narrow-band 90° RF pulse is used as mentioned above, whereby the magnetization $H_r$ of the spins of a macromolecule that are preserved as carefully as possible so as not to be saturated at the time of excitation can be transferred into that of free water through chemical exchange and/or cross relaxation after the excitation. Consequently, the level of an MR signal (echo) induced by free water and to be reflected on imaging can be made higher than that of the one acquired by utilizing the known "negative" MT effect. Moreover, the signal-to-noise ratio of an MR signal and the image contrast resolution can be improved. Since the signal-to-noise ratio is improved, the conventionally adopted technique of averaging need not be used. Since the MTC pulse is unnecessary, a scan time required can be made shorter.

Even in a normal technique of acquiring an MR signal without applying the MTC pulse (See FIGS. 9A to 9C), since the bandwidth of a known 90° selective exciting pulse is as large as approximately 1000 Hz, an MT effect is exerted in practice. A low-level signal of free water has been observed in the past. However, when this embodiment is implemented, such an incident can be avoided. A high-level signal of free water contributing to imaging can be produced.

A region of a human body that has been reported to highly exert an MT effect includes the white matter and gray matter of the brain, liver, cartilagines, and kidney. The levels of the signals induced by these regions are lowered by performing imaging based on the known "negative" MT effect. The implementation of the present invention will raise the levels of the signals of the regions.

Figure 6:
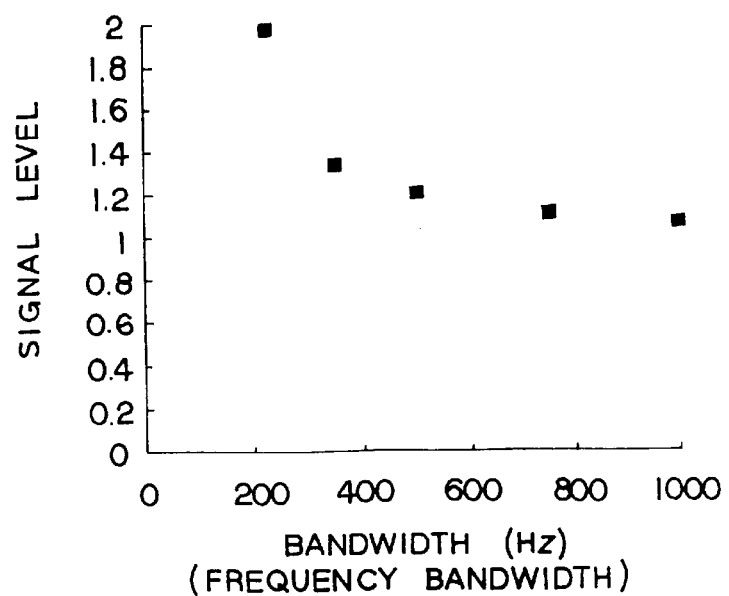
FIG. 6 is a graph plotted experimentally to show an example of the relationship between frequency bandwidths of a narrow-bandwidth RF pulse and levels of an MR signal.

The imaging sequence for yielding the "reverse" MT effect and the normal imaging sequence not bringing about any MT effect may be activated independently for the same region containing a region of tissue exerting the MT effect. Two resultant images are then used to differentiate a lesion from a normal tissue. The present inventors actually used a phantom made of polyvinyl alcohol (PVA), which had been observed to exert an MT effect, to measure a signal induced by free water in PVA by performing FE imaging after changing the bandwidth of a 90° exciting pulse. The results of the measurement are shown in FIG. 6. The axis of ordinates of the graph of the drawing indicates values calculated by normalizing a PVA signal using a reference water signal, and the axis of abscissas indicates frequency bandwidths of a 90° exciting pulse. It has been found that when the frequency bandwidth is changed from 1000 Hz to 230 Hz, the level of the PVA signal is raised to an approximately twofold level. The graph demonstrates that when the bandwidth becomes equal to or lower than approximately 800 Hz, the "reverse" MTC effect emerges substantially.

Figure 7:
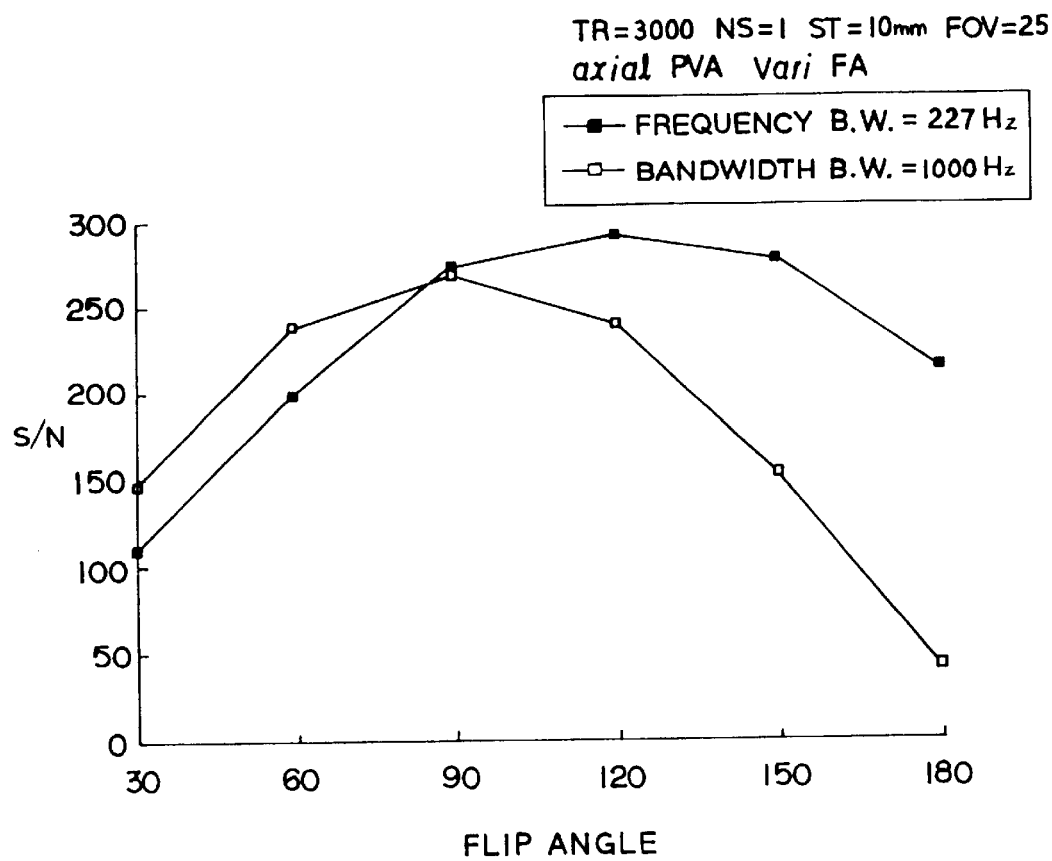
FIG. 7 is a graph plotted experimentally to show an example of the relationship between flip angles and signal-related values.

As for the influence of the flip angle produced by a narrow-band RF pulse upon the "reverse" MT effect, the present inventor has found the relationship shown in FIG. 7. The axis of ordinates in the drawing indicates (arbitrary) values concerning a signal induced by PVA and the axis of abscissae indicates values of the flip angle. When the frequency bandwidth of a slice-selective exciting pulse is a narrow bandwidth (See black squares in the drawing), the level of the PVA signal is raised because the "reverse" MT effect is exerted by a macromolecule. The graph of the drawing has revealed that since a frequency bandwidth (BW) to be excited by a narrow-bandwidth 90° pulse is 227 Hz, the flip angle should preferably be equal to or larger than 90°.

In the aforesaid embodiment, the "reverse" MT effect is adapted to fast SE imaging. Aside from this technique, the "reverse" MTC effect can apply to an echo planar imaging technique based on the FE and SE imaging sequences such as the SE, FE, and fast FE imaging. In this case, an exciting pulse employed in these imaging sequences is replaced with the aforesaid narrow-bandwidth RF pulse.

Figure 10A:
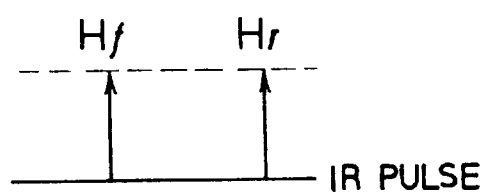
FIGS. 10A and 10B are diagrams for explaining the "reverse" MT effect for inversion-recovery imaging.
Figure 10B:
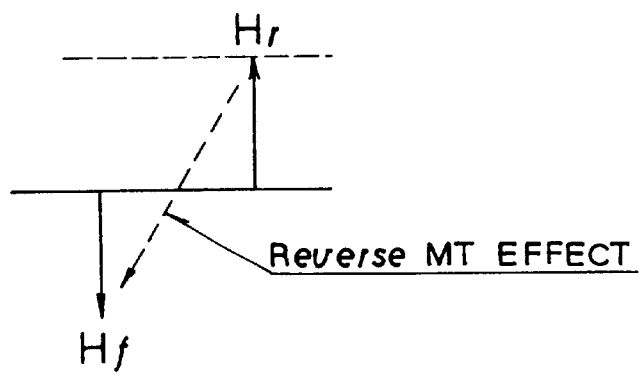

The narrow-bandwidth RF pulse relevant to the "reverse" MT effect of the present invention can be used not only for the EPI technique based on the FE and SE imaging sequences but also as an IR pulse employed in IR and fast IR (FLAIR) imaging. For IR imaging, in particular, the T1 value of a matter exerting an MT effect varies with the "reverse" MT effect. When an IR pulse is set to a narrow band, as shown in FIGS. 10A and 10B, the "reverse" MT effect occurs. Consequently, an observed signal (induced by free water) becomes a high-level signal owing to the contribution of the nature of the "positive" MT effect.

Figure 8A:
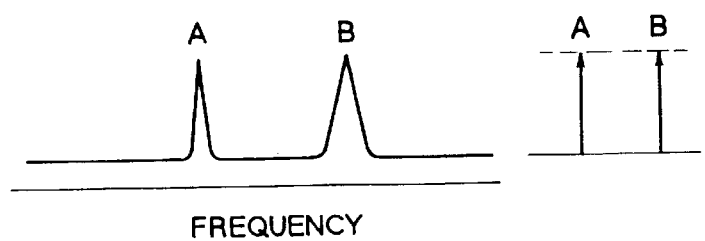
FIGS. 8A and 8B are a diagram for explaining the "reverse" MT effect for ST imaging.
Figure 8B:
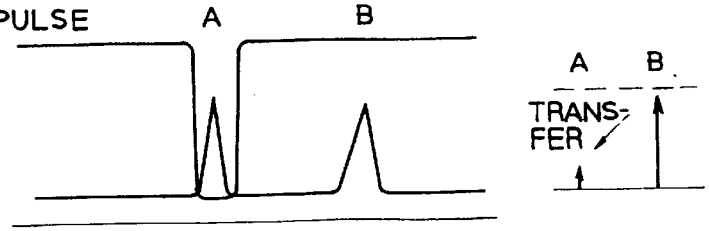

Moreover, the narrow-bandwidth RF pulse relevant to the "reverse" MT effect of the present invention is, as mentioned above, not limited to magnetic resonance imaging, but can preferably be employed in an imaging technique which is based on an ST technique that is one NMR phenomenon and which is reported by Forsen and Hoffman. As shown in FIGS. 8A and 8B, when two kinds of pools of nuclei A and B have a relationship of chemical exchange and/or cross relaxation, the pool of nuclei A is excited by a narrow-bandwidth RF pulse. The pool of nuclei A then undergoes a magnetization transfer from the other pool of nuclei B after excitation. The level of an MR signal induced by the pool of nuclei A can thus be raised. This results in an improved signal-to-noise ratio. Consequently, high-precision spectroscopy can be achieved on the basis of an NMR phenomenon.

As described so far, the MR signal acquisition method, magnetic resonance imaging method, and magnetic resonance imaging system of the present invention are based on the unprecedented "reverse" MT effect for improving an MR signal induced by an object pool of nuclei, which is yielded by degrading an ST effect and MT effect as much as possible, exciting on a frequency-selective basis only the spins of the object pool of nuclei using a narrow-bandwidth RF pulse, and thus causing a magnetization transfer from another pool of nuclei having the relationship of chemical exchange and/or cross relaxation with the object pool of nuclei. Consequently, unlike the known ST or MTC method in which pre-irradiation is performed on a frequency-selective basis in order to excite an object pool of nuclei, so that it can be observed that the level of a signal induced by a pool of nuclei having the relationship of chemical exchange and/or cross relaxation with the object pool of nuclei is lowered, the method of the present invention makes it possible to improve the signal-to-noise ratio of an MR signal by raising the level of the MR signal and enables MR imaging with high image-quality and NMR spectroscopic analysis with high precision.

The second embodiment of the present invention will be described with reference to FIGS. 11 to 31.

The schematic configuration of a magnetic resonance imaging system in accordance with this embodiment is a magnetic resonance imaging system comprising the same components as those in the first embodiment (refer to FIG. 1). The gradient sequencer 5a has a computer and receives a signal commanding an acquisition pulse sequence employed in fast FLAIR or the like from a controller 6 (having a computer) for controlling the whole system. The controller 6 executes scan planning as described in FIG. 26 through interaction via the input unit 13.

Several features concerning imaging adopted by this embodiment will be described.

(1) Usable pulse sequence

A pulse sequence usable for the magnetic resonance imaging system of the second embodiment is an IR (inversion-recovery) pulse sequence including an inversion pulse.

To be more specific, a pulse sequence that is a combination of an inversion pulse (frequently, referred to as "IR pulse") with an FE (or fast FE) pulse sequence, a FLAIR pulse sequence that is a combination of an inversion pulse with an SE pulse sequence, a fast FLAIR pulse sequence that is a combination of an inversion pulse with a fast SE pulse sequence, and a pulse sequence that is a combination of an inversion pulse with EPI (echo planar imaging) pulse sequence are usable.

Used in one mode of fast FLAIR is an IR pulse sequence employed in polarity altered spectral and spatial selective acquisition (PASTA) in which fast SE is implemented.

(2) Nested structure of pulse and imaging sequences

In this embodiment, multislice scan is executed according to a pulse sequence including an inversion pulse. Nesting is adopted for determining the orders of inversion sequences each including an inversion sequence and succeeding imaging (signal acquisition) sequence which are applied to a plurality of slices. The nesting is available in two modes; sequential and interleave modes.

Figure 11:
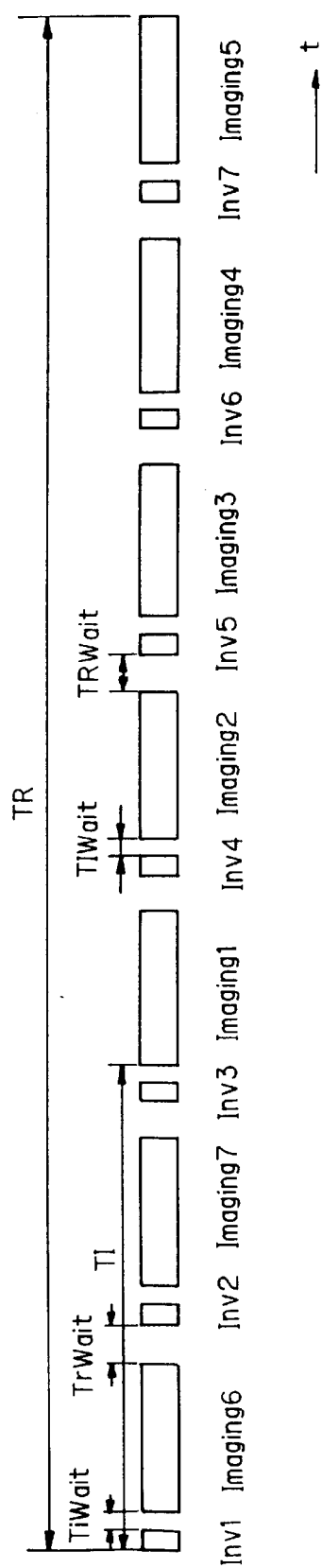
FIG. 11 shows a pulse sequence that is employed in an example of fast FLAIR and that results from (sequential mode) nesting.
Figure 12A:
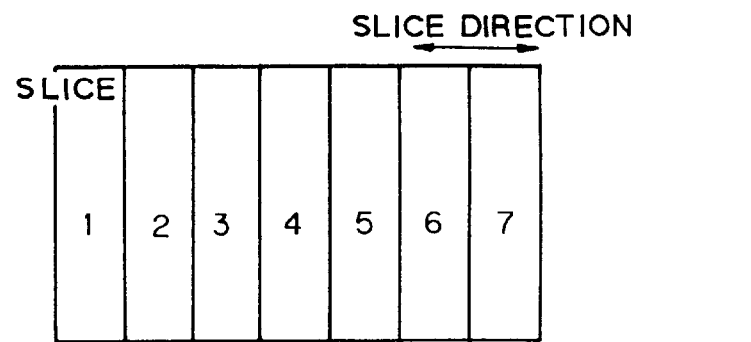
FIGS. 12A and 12B are diagrams for explaining the relationship among a plurality of slices, slice positions, and times in sequential mode.
Figure 12B:
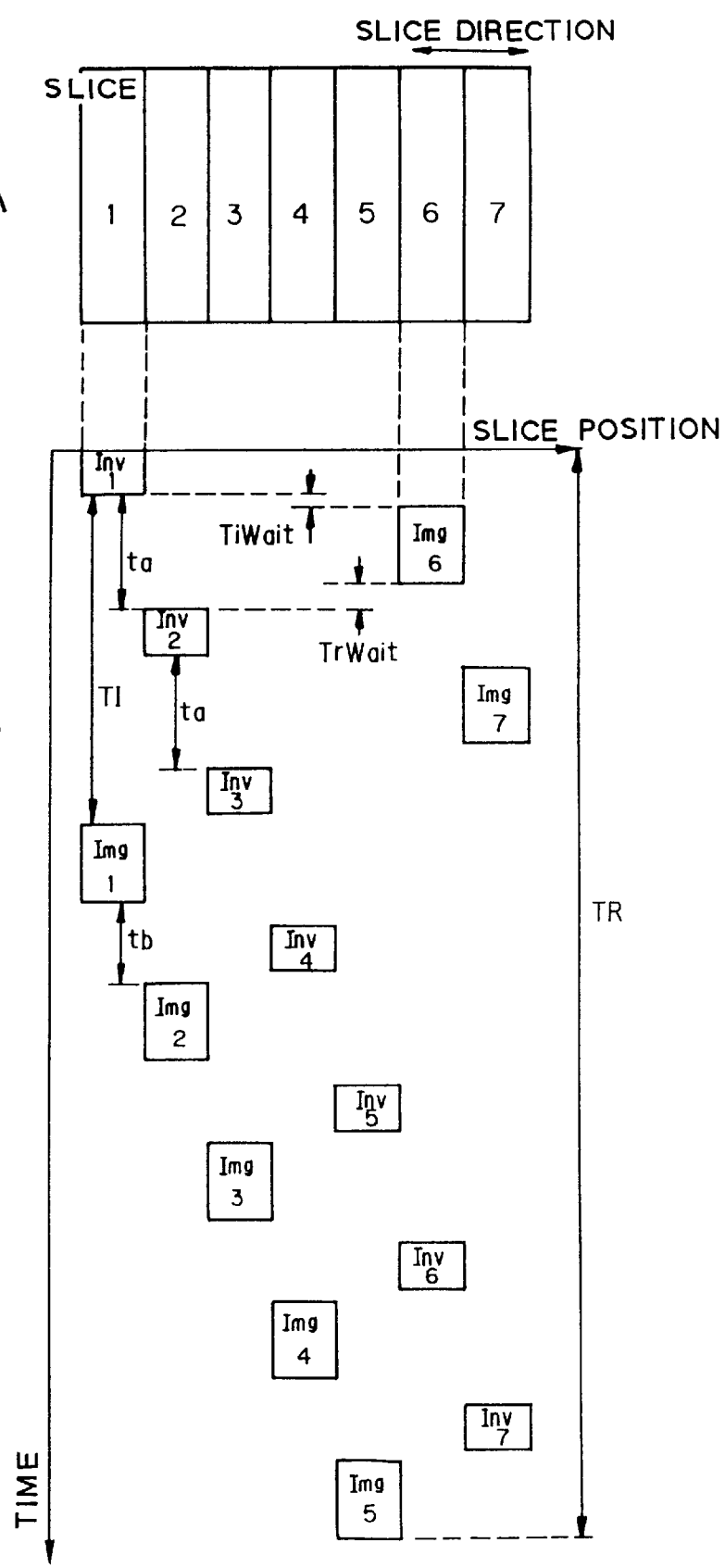

FIGS. 11 and 12A, 12B show a example of a nested pulse sequence resulting from sequential-mode nesting. As shown in FIG. 11, Inv1 to Inv7 denote seven inversion sequences each including an inversion pulse, and Imaging1 to Imaging7 denote seven associated imaging sequences. FIG. 12A shows seven adjoining slices 1 to 7 subjected to a multislice scan according to the nested pulse sequence.

First, an inversion sequence Inv1 is applied to a first slice 1. After a first adjustment time TiWait after the application of the inversion sequence Inv1, an imaging sequence Imaging6 is initiated for slice 6 to which an inversion sequence Inv6 has been applied during the previous repetition period. After a second adjustment time TrWait after the application of the imaging sequence Imaging6, an inversion sequence Inv2 is applied to a second slice 2. Thereafter, after the first adjustment time Tiwait, an imaging sequence Imaging7 is initiated for slice 7 to which an inversion sequence Inv7 has been applied during the current repetition period. After the second adjustment time TrWait, an inversion sequence Inv3 is applied to a third slice 3. After the first adjustment time TiWait, an imaging sequence Imaging1 is initiated for slice 1 to which the inversion sequence Inv1 has been applied. After the second adjustment time TrWait, an inversion sequence is applied to a fourth slice 4. Thereafter, application of pulses and acquisition of an MR signal are performed in the same manner toward an imaging sequence Imaging2, an inversion sequence Inv5, an imaging sequence Imaging3, an inversion sequence Inv6, an imaging sequence Imaging4, an inversion sequence Inv7, in turn as shown in FIGS. 11 and 12B. An imaging sequence Imaging5 is initiated for a fifth slice5. Thus, a repetition time TR elapses.

As mentioned above, when a nested pulse sequence results from sequential-mode nesting, imaging sequences (Imaging6 and Imaging7) to be initiated for two slices (slices 6 and 7) and inversion sequences (Inv2 and Inv3) to be applied to two other slices (slices 2 and 3) are set alternately for an inversion time TI between the inversion sequence Inv1 and the associated imaging sequence Imaging1. Pulse sequences for two slices wherein the number of slices is comparable to the number of offsets are nested. The orders of slices from which data is acquired are consecutive; such as, slices 6, 7, and 1 to 5. The timing of applying inversion sequences and initiating imaging sequences to and for slices 1 to 7 is shown in FIG. 1 2B imaginatively.

Figure 13:
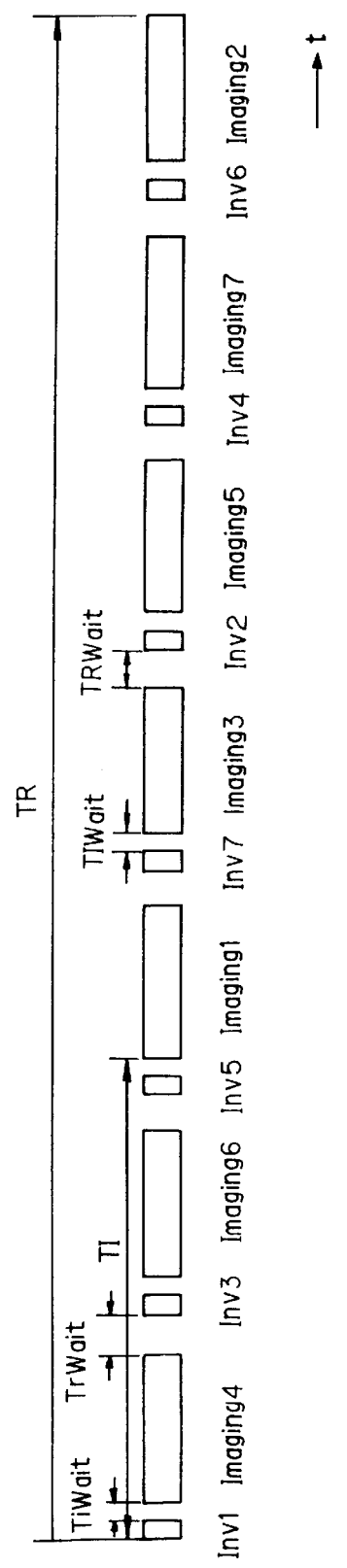
FIG. 13 shows a pulse sequence that is employed in an example of fast FLAIR and that results from (interleave mode) nesting.
Figure 14A:
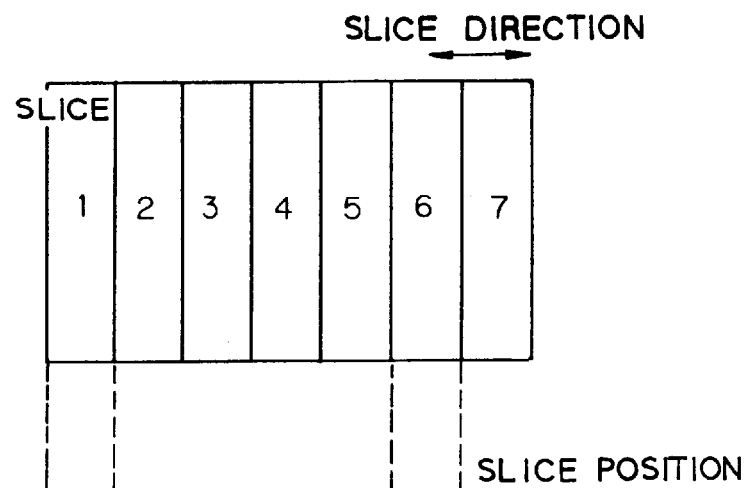
FIGS. 14A and 14B are diagrams for explaining the relationship among a plurality of slices, slice positions, and times.
Figure 14B:
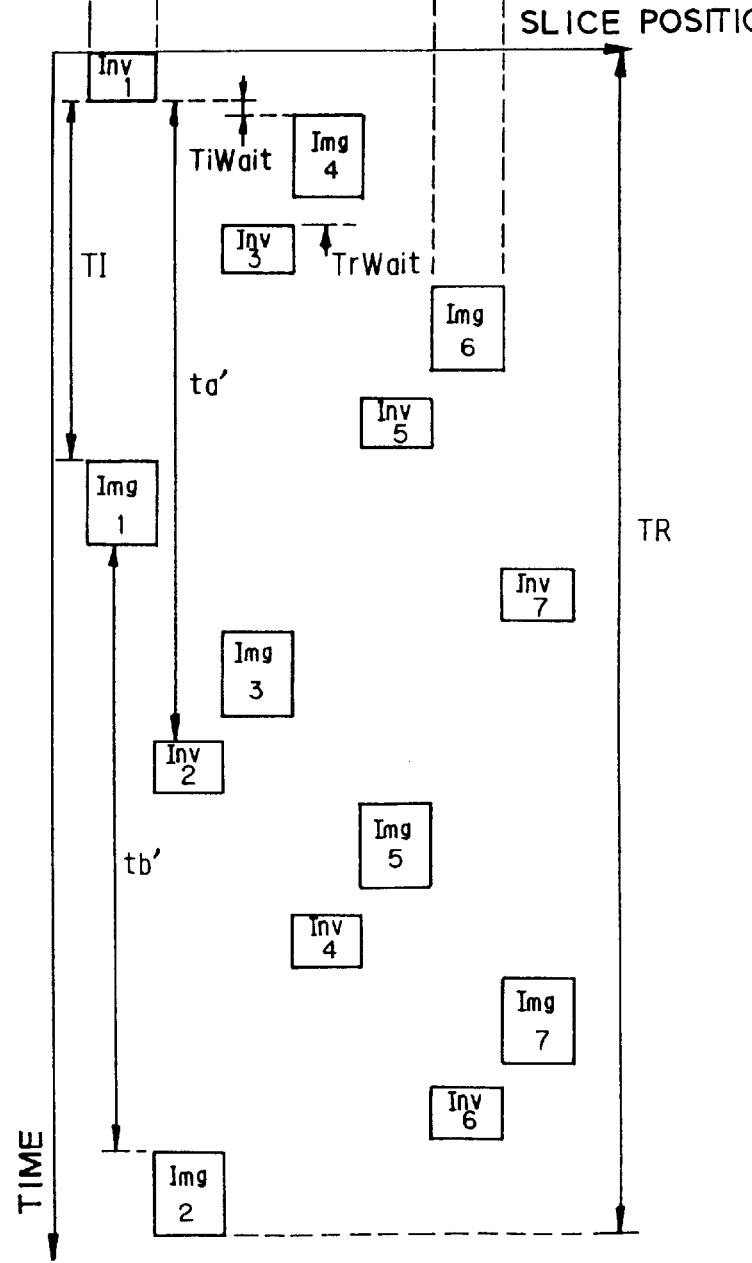
Figure 15:
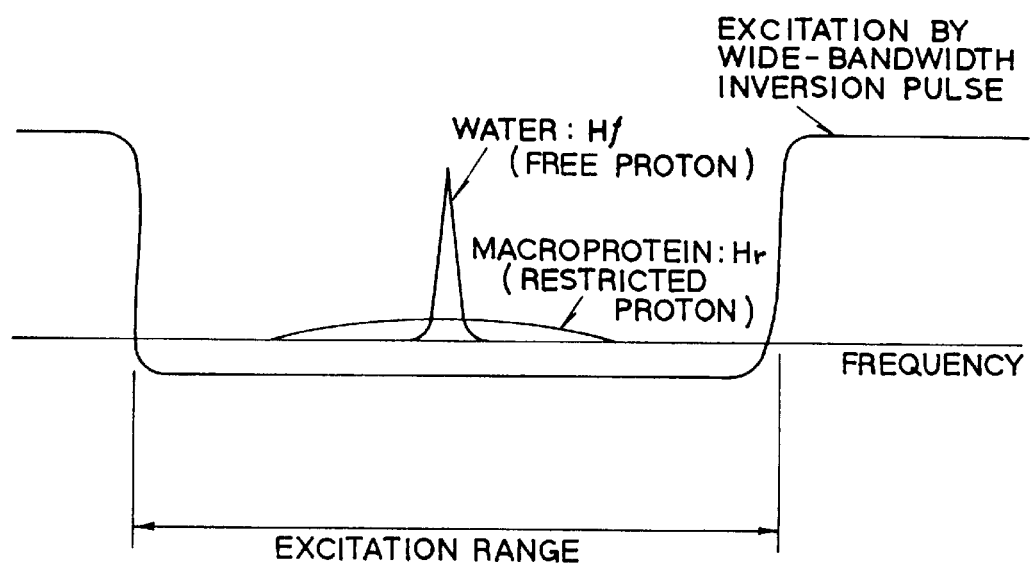
FIG. 15 is an explanation of a wide-bandwidth of an inversion pulse.

On the other hand, FIGS. 13 and 14A, 14B show an example of a nested pulse sequence resulting from interleave-mode nesting. In FIG. 13, similarly to those in the above drawings, Inv1 to Inv7 denote inversion sequences each including an IR pulse. Imaging1 to Imaging7 denote associated imaging sequences. FIG. 14A shows seven adjoining slices 1 to 7 subjected to multislice scan according to the nested pulse sequence.

First, an inversion sequence Inv1 is applied to a first slice 1. Thereafter, after a first adjustment time TiWait after the application of the inversion sequence Inv1, an imaging sequence Imaging4 is initiated for a fourth slice 4 to which an inversion sequence Inv4 has been applied during the previous repetition period. After a second adjustment time TrWait after the application of the imaging sequence Inv4, an inversion sequence Inv3 is applied to a third slice 3. Thereafter, after the first adjustment time TiWait after the application of the inversion sequence Inv3, an imaging sequence Imaging6 is initiated for a sixth slice 6 to which an inversion sequence Inv6 has been applied during the previous repetition period. After the second adjustment time TrWait, an inversion sequence Inv5 is applied to a fifth slice 5. After the first adjustment time TiWait, an imaging sequence Imaging1 is initiated for the first slice 1 to which the inversion sequence Inv1 has been applied. After the second adjustment time TrWait, an inversion sequence Inv7 is applied to a seventh slice 7. Hereinafter, application of pulses and acquisition of an MR signal are performed in the same manner toward an imaging sequence Imaging3, an inversion sequence Inv2, an imaging sequence Imaging5, an inversion sequence Inv4, an imaging sequence Imaging7, an inversion sequence Inv6, in turn, as shown in FIGS. 13 and 14B. When an imaging sequence Imaging2 is initiated for the second ky slice2, a repetition time TR elapses.

In case of the interleave-mode nesting, imaging sequences (Imaging 4 and Imaging6) to be initiated for two other slices (slices 4 and 6) and inversion sequences (Inv3 and Inv5) to be applied to two other slices (slices 3 and 5) are set alternately for an inversion time TI between one inversion sequence Inv1 and the associated imaging sequence Imaging1. Thus, pulse sequences for two slices that are the number of slices comparable to the number of offsets are nested. Moreover, the orders of slices from which data is acquired are alternate; such as, slices 4, 6, 1, 3, 5, and 7. The timing of applying inversion sequences and initiating imaging sequences to and for the slices 1 to 7 is shown in FIG. 14B imaginatively.

(3) Considering two adjustment times TiWait and TrWait

In whichever mode nesting is effected; in sequential mode or interleave mode, as mentioned above (FIGS. 11 and 13), two adjustment times TiWait and TrWait are set temporally before and after an imaging sequence (or inversion sequence) for each slice.

This is intended to maximize the number of slices, minimize and average an MT effect to be exerted onto a plurality of slices, and assist a user in readily setting a repetition time TR and inversion time TI. In this embodiment, this intention is attained using two adjustment times TiWait and TrWait. These times are set according to the expressions below.

Assuming that a repetition time is TR, an inversion time is TI, the number of multiple slices is NS, the number of inversion sequences Inv to be applied to one slice for the inversion time TI is TIoffset, a duration of an inversion sequence Inv is InvTime, a duration of an imaging sequence Imaging is ScanTime, and the first and second adjustment times are TiWait and TrWait, the repetition time TR and inversion time TI are given by the following expressions:

TR=NS (InvTime+ScanTime+TrWait+TiWait)  (1)

TI=TIoffset (InvTime+TiWait)+(TIoffset−1)(ScanTime+TrWait)  (2)

According to these two expressions, the first adjustment time TiWait and second adjustment time TrWait are calculated and set temporally before and after an imaging sequence (or inversion sequence).

However, as described later, a user initially designates arbitrary values for the repetition time TR and inversion time TI. Two values of the adjustment times TiWait and TrWait calculated according to the two expressions may be positive or negative values or zeros. However, since physical adjustment times are set, the adjustment times TiWait and TrWait are limited to positive values or zero (i.e., negative values are excluded).

When the conditions of the time values are taken into consideration, the number of slices NS does not always agree with a designated value. In this embodiment, therefore, based on the values designated for the repetition time TR, inversion time TI, duration of an imaging sequence Imaging ScanTime, and duration of an inversion sequence Inv InvTime, the possible values of the number of slices NS, number of offsets Offset (number of slices nested within the inversion time TI), and first and second adjustment times TiWait and TrWait which are calculated according to the two expressions are presented.

Figures 28, 29:
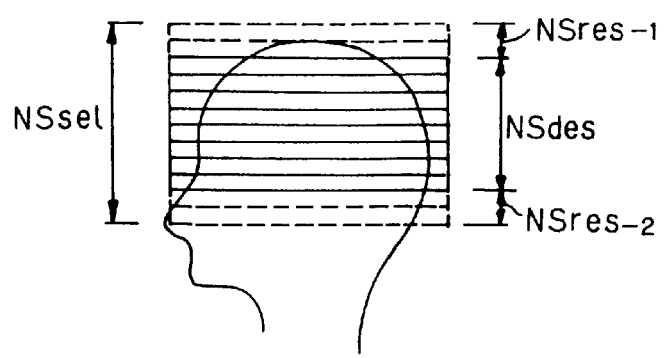
FIG. 28 is a diagram showing an example of a display of recommended data on a display unit.
FIG. 29 is an explanatory diagram illustrating slice positions subjected to dummy scan.

Consequently, the number of slices NS is usually given as discrete values to be paired with values of the number of offsets Offset (See FIG. 28). For example, when TR=8000 msec., TI=2000 msec., ScanTime=240 msec., and InvTime= 15 msec. are specified, since a maximum number of slices that can be scanned, NS, is regarded as the largest number of slices that can be calculated relative to the same number of offsets, the NS value of 25 is attained by setting the number of offsets to 7. The discrete values of the number of slices NS are 3, 7, 10, 14, 17, 21, and 25. The values of the number of offsets relative to these values of the number of slices NS are 1, etc., and 7. In other words, the number of slices and the number of nesting levels are automatically set in pairs.

As mentioned above, the number of slices desired by a user does not always agree with the number of slices NS set automatically. For saving the memory area in a memory for storing acquired MR data, it is preferred that the number of slices can be varied in increments or decrements of 1. For satisfying both the conditions of one-by-one variation and of averaging of an MT effect, this embodiment adopts a method described below. That is to say, the number of slices desired by a user, NSdes, is met, and a necessary minimum number of slices computed automatically (a maximum number of slices) NS is specified automatically; and when an unnecessary slice is present, the slice is automatically specified and "dummy scan" is commanded for the slice. "Dummy scan" means that RF pulses and magnetic field gradients are actually applied to an unnecessary slice, but resultant echoes are not acquired. If the resultant echoes were acquired, they would not be involved in image reconstruction.

(4) MT effect and reverse MT (RMT) effect

The MT (magnetization transfer) effect is stated as the phenomenon of chemical exchange and/or cross relaxation between protons of different kinds of pools of nuclei, for example, free water and a macromolecule. In other words, the MT effect is a transfer of the magnetization of protons of, for example, free water into the magnetization of protons of a macromolecule by means of an inversion pulse of a wide frequency bandwidth shown in FIG. 15, and acknowledged as a phenomenon of lowering a level of a signal induced by the free water (refer to FIGS. 9A to 9C).

By contrast, when the combination of free water and a macromolecule is taken, for instance, it is apparent that an MT effect of raising the level of a free water signal (hereinafter, RMT (reverse MT) effect) is exerted.

Figure 16:
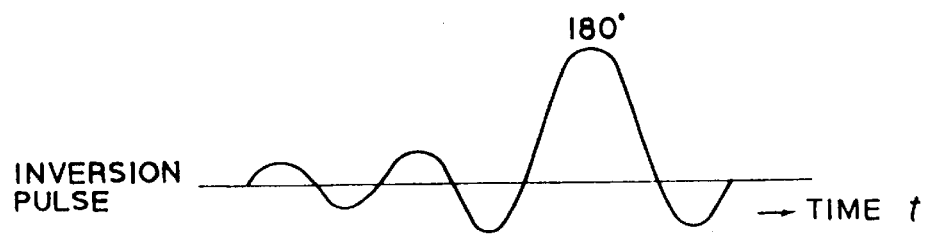
FIG. 16 is a waveform diagram showing an example of an inversion pulse.
Figure 17:
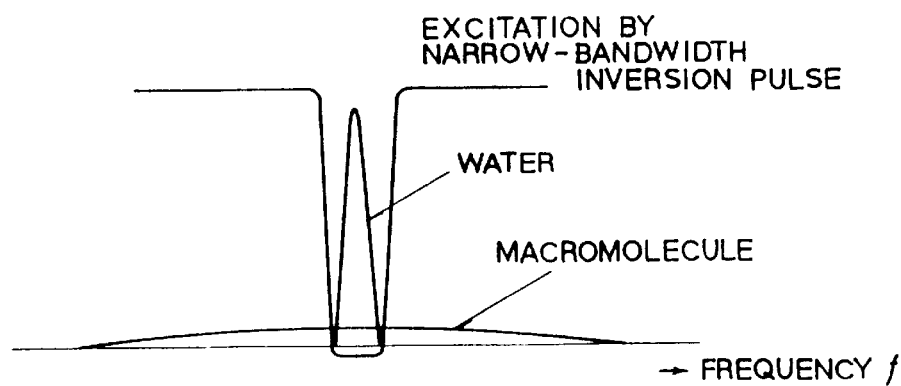
FIG. 17 is a diagram showing an excitation range of a narrow-band inversion pulse.

For example, an inversion pulse (for example, a 180° RF pulse) is, as shown in FIG. 16, given by a sinc function containing an increased multiplier of lobes and has long side lobes. The pulse duration is thus made long as a whole. The excitation range of the inversion pulse within the pulse duration is, as shown in FIG. 17, substantially similar to the narrow bandwidth in the frequency spectrum of an object pool of nuclei (for example, a pool of protons of free water) in a patient body.

Assume that one of two kinds of pools of nuclei which have a coupled relationship deriving from chemical exchange and/or cross relaxation is protons of free water, and the other pool is protons of a macromolecule. When the protons of free water are regarded as an object pool of nuclei, the multiplier of lobes determining the duration of an inversion pulse is, for example, set to −4 and +1. Thus, the pulse duration is set to 22 msec. Consequently, the excitation bandwidth of the inversion pulse becomes 227 Hz and is, as shown in FIG. 17, a "narrow bandwidth" substantially agreeing with the bandwidth of free water on a spectral curve. For example, when the multiplier of lobes is set to ±2 and the pulse duration is set to 15 msec., the excitation bandwidth becomes a "narrow bandwidth" of 267 Hz.

When a slice-selective magnetic field gradient is applied together with the inversion pulse, a region of a patient body with a given slice width is selected. Moreover, the spins of protons of free water on the plane of the slice are excited on a frequency-selective basis and flipped onto a $-z'$ axis (rotational coordinates). At this time, the inversion pulse fully excites the free water alone on a frequency-selective basis, and the bandwidth of the inversion pulse is as narrow as shown in FIG. 17. The bandwidth of the inversion pulse exciting the spins of protons of a macromolecule is confined to a very narrow range. That is to say, the spins of protons of a macromolecule are hardly excited (saturated) by the inversion pulse.

Consequently, the magnetization $H_f$ of the spins of protons of free water and the magnetization $H_r$ of the spins of protons of a macromolecule remain, as shown in FIG. 5A, in an equilibrium state while retaining the chemically-coupled relationship before excitation. However, after the excitation, as shown in FIG. 5B, a magnetization transfer occurs from the magnetization $H_r$ of the unexcited (unsaturated) macromolecule into the magnetization $H_f$ of the fully-excited (saturated) free water.

In other words, the magnetization $H_r$ of the spins of a macromolecule which have been retained unsaturated to the greatest extent during excitation by a narrow-bandwidth inversion pulse can be transferred to that of free water through chemical exchange and/or cross relaxation after the excitation. The level of an MR signal (echo) induced by the free water, which is reflected on imaging, can be made higher than that of a signal acquired using the known "negative" MT effect.

A region in a human body which reportedly exerts the MT effect to a great extent includes the white matter and gray matter of the brain, the liver, the cartilages, the kidneys, and the like. The level of a signal induced by any of these regions has therefore been lowered due to the known "negative" MT effect in the past. Using the RMT effect, the levels of signals induced by the regions will be raised.

It is known that conventional inversion pulses with sinc functions are normally used in a range of approximate 1.0 msec to 0.8 msec in lobe length. This range corresponds to a normal frequency bandwidth of approximate 1000 Hz to 1250 Hz. The number of side lobes of an inversion pulse is arbitrary and trims its spectrum wave form.

The narrow frequency bandwidths of inversion pulses according to the invention are less than 1000 Hz, while the wide frequency bandwidths of those are more than 1250 Hz. For the narrow bandwidth, it is desirable to employ a range of less than 800 Hz showing substantially a noticeable MT effect. In contrast, for the wide bandwidth, the invention employs the outer frequency bandwidth to the above normal frequency bandwidth which has been thought to cause the MT effect to a certain extent.

(5) Frequency bandwidth (BW) of an inversion pulse

The relationship between the frequency bandwidth of an inversion pulse included in an inversion sequence and the phenomenon (MT effect or RMT effect) of chemical exchange and/or cross relaxation between spins of nuclei will be described below.

The results of an experiment have revealed that when the frequency bandwidth of an inversion pulse is set to a wide bandwidth (herein, 1000 Hz or larger), the MT effect is intensified (or the RMT effect is degraded).

Figure 18:
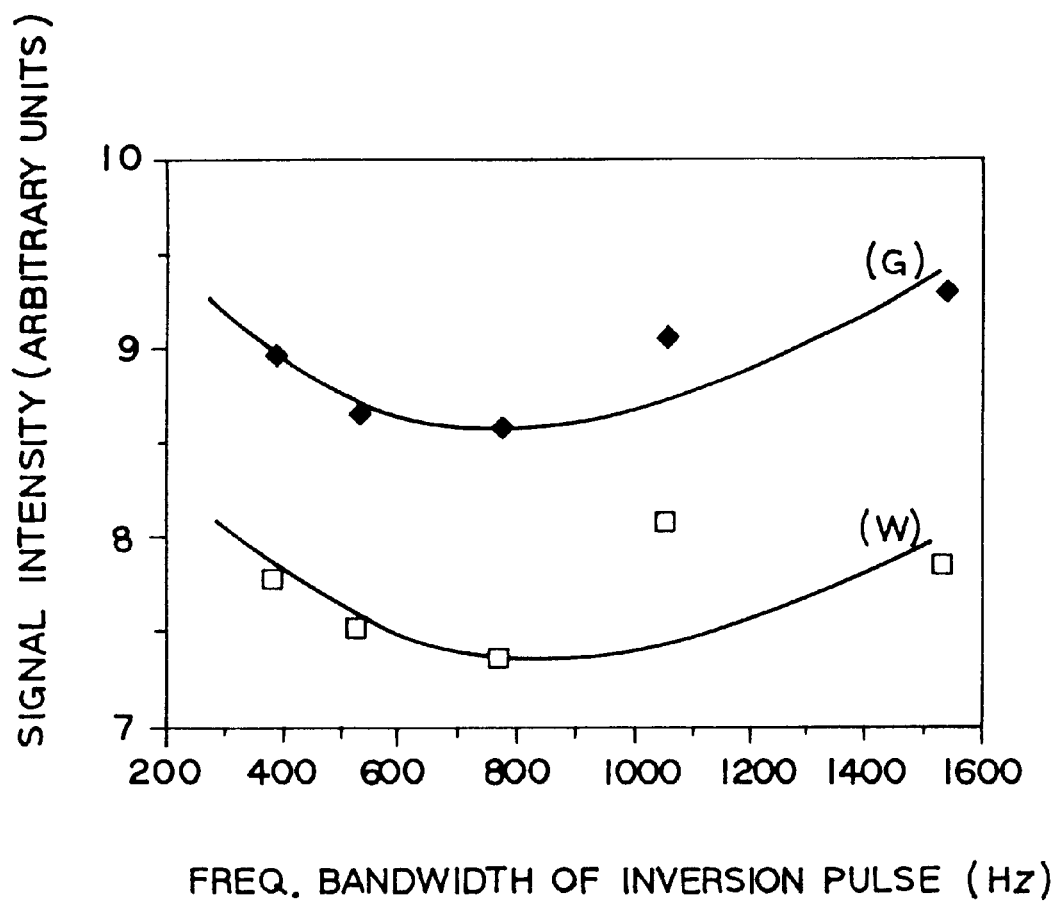
FIG. 18 is a graph plotted using data resulting from an experiment, showing an example of a relationship between changes in bandwidth of an inversion pulse and strengths of MR signals.

FIG. 18 shows changes in signal strength (arbitrary units) of signals induced by white matter (W) and gray matter (G) in the head in relation to variations of a frequency bandwidth of an inversion pulse employed in fast FLAIR. This experiment was conducted using a 0.5 tesla magnetic resonance imaging system by setting the parameters for fast FLAIR as follows: TR=6000 msec., TI=1700 msec., NS=15, and inversion pulse=±3 π, variable τ-length. The frequency bandwidth of an inversion pulse is varied from 385 Hz to 1538 Hz.

As apparent from the results of the experiment, a signal strength changes with a varying value of the frequency bandwidth of an inversion pulse. In the vicinity of bandwidth=800 Hz, the MT and RMT effects are in an equilibrium. When the bandwidth changes to either a wider or a narrower bandwidth, the signal strength increases depending on change degrees in the bandwidth. When the frequency bandwidth of an inversion pulse is expanded (in particular, more than 1000 Hz), restricted proton irradiation occurs. As a result, the MT effect is upgraded. This results in a smaller T1 app value. When the T1 app value gets smaller, recovery is speeded up. When a TI of 1700 msec. is used, a signal-to-noise ratio (signal strength) improves. In contrast, when the bandwidth is set to a narrower value than 800 Hz, the signal strength increases by the RMT effect.

(6) Frequency bandwidth of 90° RF pulse of SE (FSE) in IR pulse sequence

In FLAIR or fast FLAIR, when the frequency bandwidth of the inversion pulse is changed while that of the 90° RF pulse of the SE (FSE) imaging sequence is constant, signal strengths are qualitatively altered along an approximate U-shape curve as shown in FIG. 18. However, the 90° RF pulse is additionally changed in its frequency bandwidth, the entire U-shape curve is moved horizontally on the FIG. 18. Therefore, both the frequency bandwidths of the inversion pulse and 90° RF pulse can be used for specifying image contrast, thereby increasing flexibility in selecting parameters of image contrast.

(7) Applying the MT effect

Figure 19:
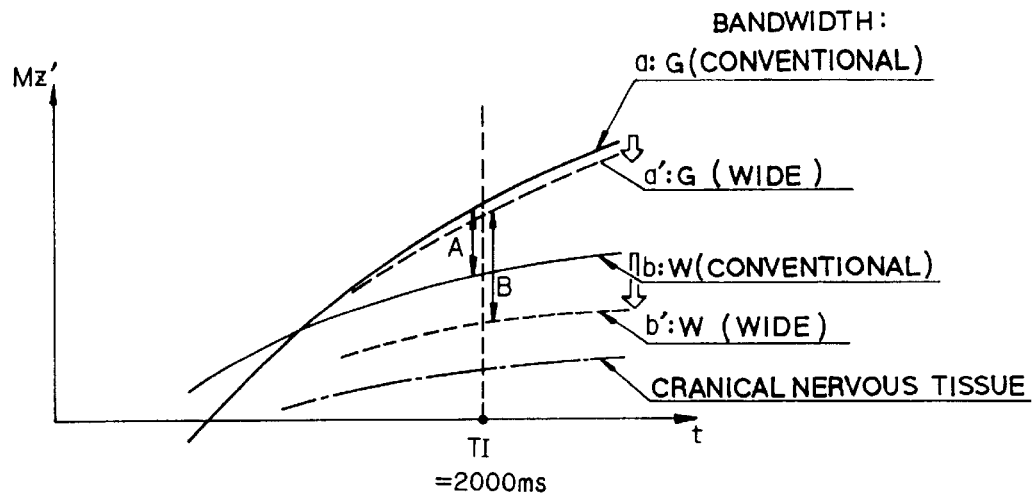
FIG. 19 is a diagram for explaining the MT effect to be exerted when an inversion pulse is set to a wide bandwidth.

When the frequency bandwidth of an inversion pulse is set to a wide band, the MT effect of lowering the level of a signal to be acquired can be reflected on imaging. The principles will be described in conjunction with FIG. 19. The graph of FIG. 19 is plotted using data provided under such scanning conditions as: 1.5 tesla, TR=about 7000 msec., and TI=2000 msec.

Taking fast FLAIR for instance, the frequency bandwidth of an inversion pulse is set to a wide bandwidth of, for example, 1250 Hz or larger by, for example, shortening the lobe length of the inversion pulse. Owing to the wide band, the MT effect is, as mentioned above, upgraded. As far as fast FLAIR is concerned, the MT effect is upgraded by optimizing an FSE pulse sequence employed. Assume that a region to be scanned is the head, that curves plotted to show the longitudinal magnetizations Mz' (that is, signal levels) of the white matter (W) and gray matter (G) detected when the frequency bandwidth of an inversion pulse are set to a normal band (about 1000 to 1250 Hz) but not set to a wide bandwidth are curves a and b, and that curves plotted to show the longitudinal magnetizations Mz' thereof detected when the frequency bandwidth of the inversion pulse is set to a wide range are curves a' and b'. Since the exertion rate of the MT effect by the white matter is larger than that by the gray matter, when the frequency bandwidth of an inversion pulse is set to a wide bandwidth, a drop in signal level of a signal induced by the white matter (W) is larger than that induced by the gray matter (G). For example, when the inversion time TI is set to 2000 msec. for observation, if the frequency bandwidth of an inversion pulse is set to a normal bandwidth, a difference in signal level between the white matter (W) and gray matter (G) is indicated as A in FIG. 19. By contrast, if the frequency bandwidth of an inversion pulse is set to a wide bandwidth, the difference in signal level becomes B (larger than A). The large or small difference in signal level, A or B, can be reflected on contrast. Specifically, the employment of a wide-bandwidth inversion pulse can improve the contrast between the white matter and gray matter.

(8) Applying the RMT effect

When the frequency bandwidth of an inversion pulse is set to a narrow bandwidth, the RMT effect of raising the level of a signal to be acquired can be reflected on imaging. The principles will be described in conjunction with FIG. 20. The scanning conditions are set to, for example, the same values as those concerning FIG. 19.

Figure 20:
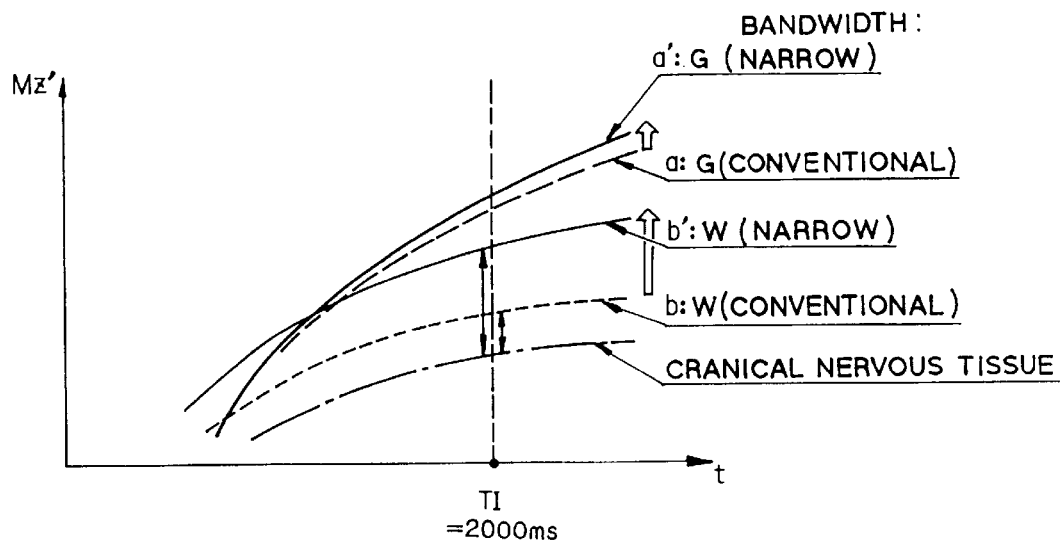
FIG. 20 is a diagram for explaining the RMT effect to be exerted when an inversion pulse is set to a narrow bandwidth.

Taking fast FLAIR for instance, the frequency bandwidth of an inversion pulse is set to a narrow bandwidth of 1000 Hz or smaller by, for example, extending the lobe length of the inversion pulse. Owing to the narrow band, as mentioned above, the RMT effect is made more outstanding. As far as fast FLAIR is concerned, the RMT effect is upgraded by optimizing an employed FSE pulse sequence. Assume that a region to be scanned is the head, that curves plotted to show the longitudinal magnetizations $Mz'$ (that is, signal levels) of the white matter (W) and gray matter (G) detected when the frequency bandwidth of an inversion pulse is a normal bandwidth (about 1000 to 1250 Hz) but not set to a wide band are curves a and b, and that curves plotted to show the longitudinal magnetizations $Mz'$ thereof detected when the frequency bandwidth of an inversion pulse is set to a narrow bandwidth are curves a' and b'. Since the exertion rate of the RMT effect by the white matter (W) is larger than that by the gray matter (G), when the frequency bandwidth of an inversion pulse is set to a narrow band, a rise in level of a signal induced by the white matter (W) is larger than that by the gray matter (G). For example, when the inversion time TI is set to 2000 msec. for observation, if the frequency bandwidth of an inversion pulse is set to a normal bandwidth, a difference in signal level between the basal ganglia and white matter (W) is indicated as A in. FIG. 20. By contrast, if the frequency band of an inversion pulse is set to a narrow band, the difference in signal level between them is indicated as B (larger than A). Consequently, the contrast between the basal ganglia and white matter (W) improves, and the efficiency of rendering the nervous tissue in the white matter (W) improves. The improvement in contrast between the white matter and cranial nervous tissue is thought to attribute to the fact that the apparent Ti of the white matter gets longer due to the RMT effect and a signal level can be retained for a prolonged period of time.

(9) Flip angle to be produced by an inversion pulse

Figure 21:
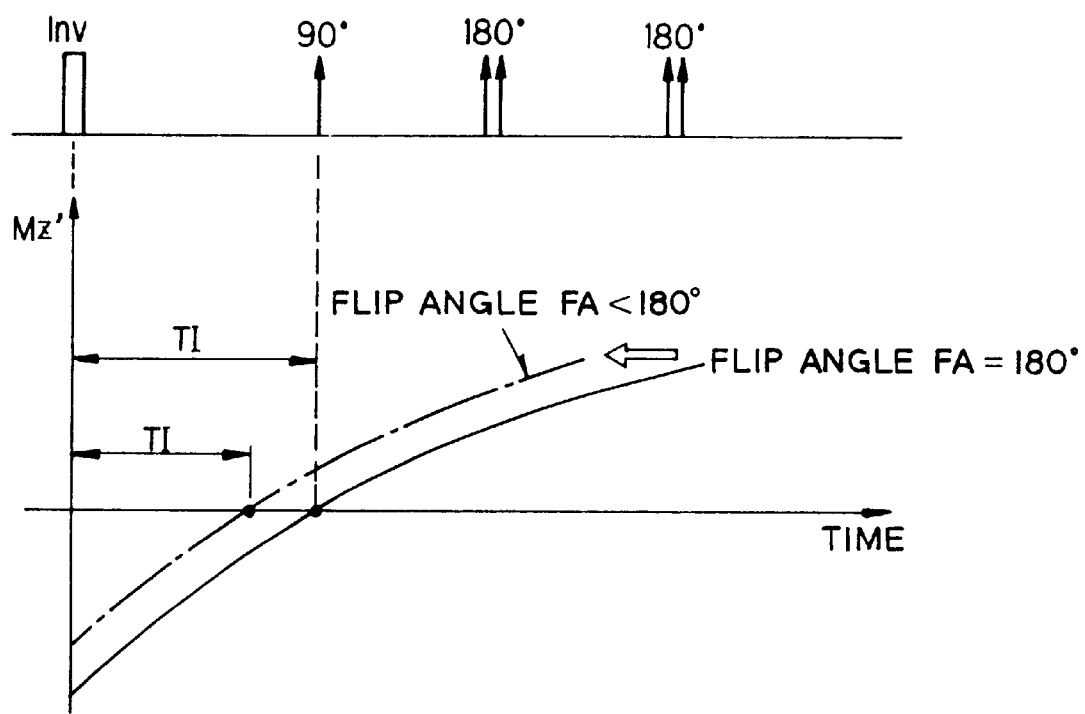
FIG. 21 is a diagram for explaining variations of a flip angle to be produced by an inversion pulse and changes in TI.

For scanning the head according to an IR pulse sequence, normally, an inversion pulse is used to make an MR signal induced by the cerebral spinal fluid (CSF) null. An inversion time TI (time from an inversion pulse to an FES pulse sequence) is, as shown in FIG. 21, set to a time indicated as a length on the axis of times from the point associated with an inversion pulse to a null point on the recovery time curve plotted to show longitudinal magnetizations. When "the flip angle FA produced by an inversion pulse is set to a value larger than 180°," the null point can be shifted leftward toward a shorter inversion time. In addition to that the MT or RMT effects are further intensified. When the flip angle is lowered down to 150°, the repetition time TR can be made shorter than that associated with the flip angle of 180° and the scan time can also become shorter.

(10) Tailoring an inversion time TI

When an IR pulse sequence is employed in FLAIR or fast FLAIR, an inversion time TI is set to a time indicated in FIG. 21 as a length on the axis of times from the point associated with an inversion pulse to the null point on the curve. However, when the inversion time TI is set to a shorter time or set as a "short TI," a different parameter can be enhanced. When the "short TI" is specified for FLAIR, a T1-enhanced image that is an image whose contrast is dependent on a T1 enhancement can be produced. When the "short TI" is specified for fast FLAIR, a T2-weighted image that is an image whose contrast dependent on a T2 enhancement can be produced.

Setting an inversion pulse to a wide bandwidth (facilitating the MT effect) or to a narrow bandwidth (facilitating the RMT effect) can also be applied to the "short T1" method.

(11) Fat suppression by PASTA

Polarity altered spectral and spatial selective acquisition (PASTA) that is one of the fat suppression techniques can be incorporated in imaging according to the aforesaid IR pulse sequence. The PASTA is described in, for example, "A Polarity Altered Spectral and Spatial Selective Acquisition Technique" (SMR, Vol. 657, 1995). The summary will be presented below in conjunction with FIGS. 22 to 25.

Figure 22:
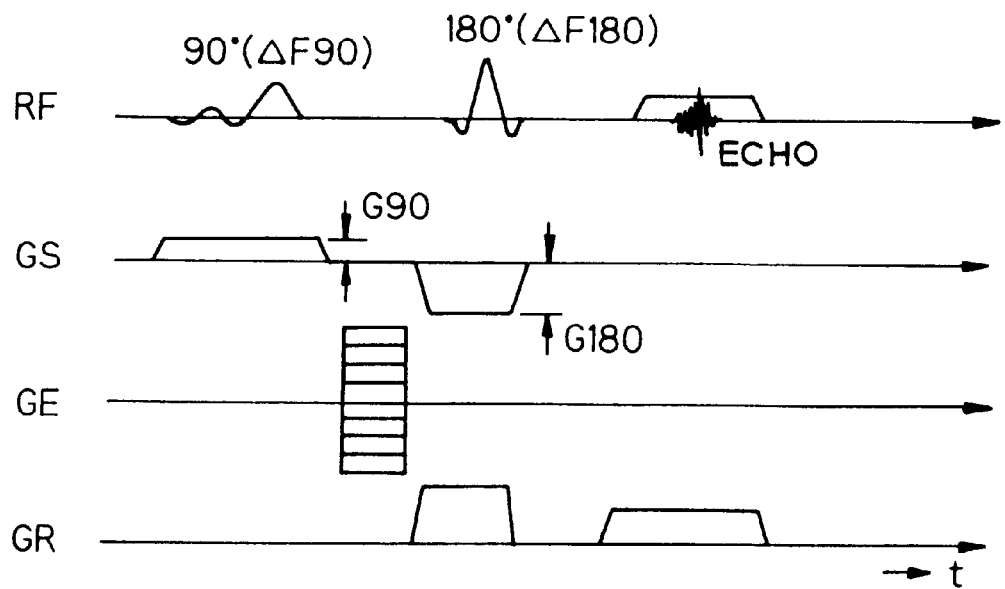
FIG. 22 shows a pulse sequence for explaining PASTA.
Figure 23:
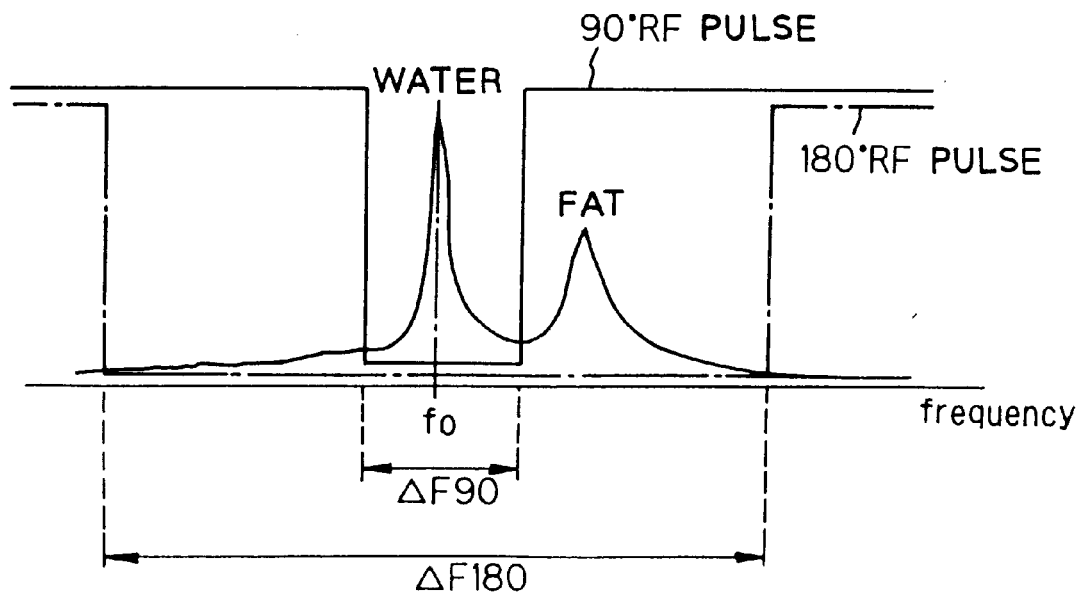
FIG. 23 is a diagram for explaining the frequency band of a narrow-band 90° RF exciting pulse employed in PASTA.

FIG. 22 shows a pulse sequence employed in the PASTA having the effect of suppressing a signal induced by fat. FIG. 23 shows the frequency bands of a 90° RF exciting pulse and a 180° RF refocusing pulse causing inversion of spins. The 90° RF pulse is produced to have a waveform given by the sinc function so that the 90° RF pulse within the frequency band will have a rectangular waveform. For shortening an echo time TE, the 90° RF pulse is reshaped to appear symmetric on the axis of times. For example, when the 90° RF pulse is used for 1.5 tesla magnetic resonance imaging, the pulse duration is set to 16 msec., the τ-length is set to 4 msec., and the bandwidth BW is set to 250 Hz. The frequency band of the 90° RF pulse is set to a narrow band $\Delta F90$ permitting the 90° RF pulse to excite spins of water on the center of a slice in the presence of a first magnetic field gradient G90 changing in a slice direction and not to excite spins of fat. By contrast, the frequency band $\Delta F180$ of the 180° RF pulse is set larger than the one $\Delta F90$ of the 90° RF pulse.

For suppressing acquisition of a signal induced by fat, a second magnetic field gradient G180 changing in the slice direction is made opposite in polarity to the first magnetic field gradient G90. Moreover, the strength of the second magnetic field gradient G180 is set to be an n (n>2) multiple of that of the first magnetic field gradient G90. The relationship between slice positions and frequencies is shown in FIG. 24 relative to the strength ratio.

Next, the behaviors of spins will be described. When a 90° RF exciting pulse is applied in the presence of the first magnetic field gradient G90 in the initial state shown in FIG. 25A, spins of water on a slice of slice position A–A' in FIG. 24 (FIG. 25B) and spins of fat on a slice of slice position C–C' in FIG. 24 (FIG. 25D) are leveled to an X' axis in rotational coordinates, respectively.

Figure 24:
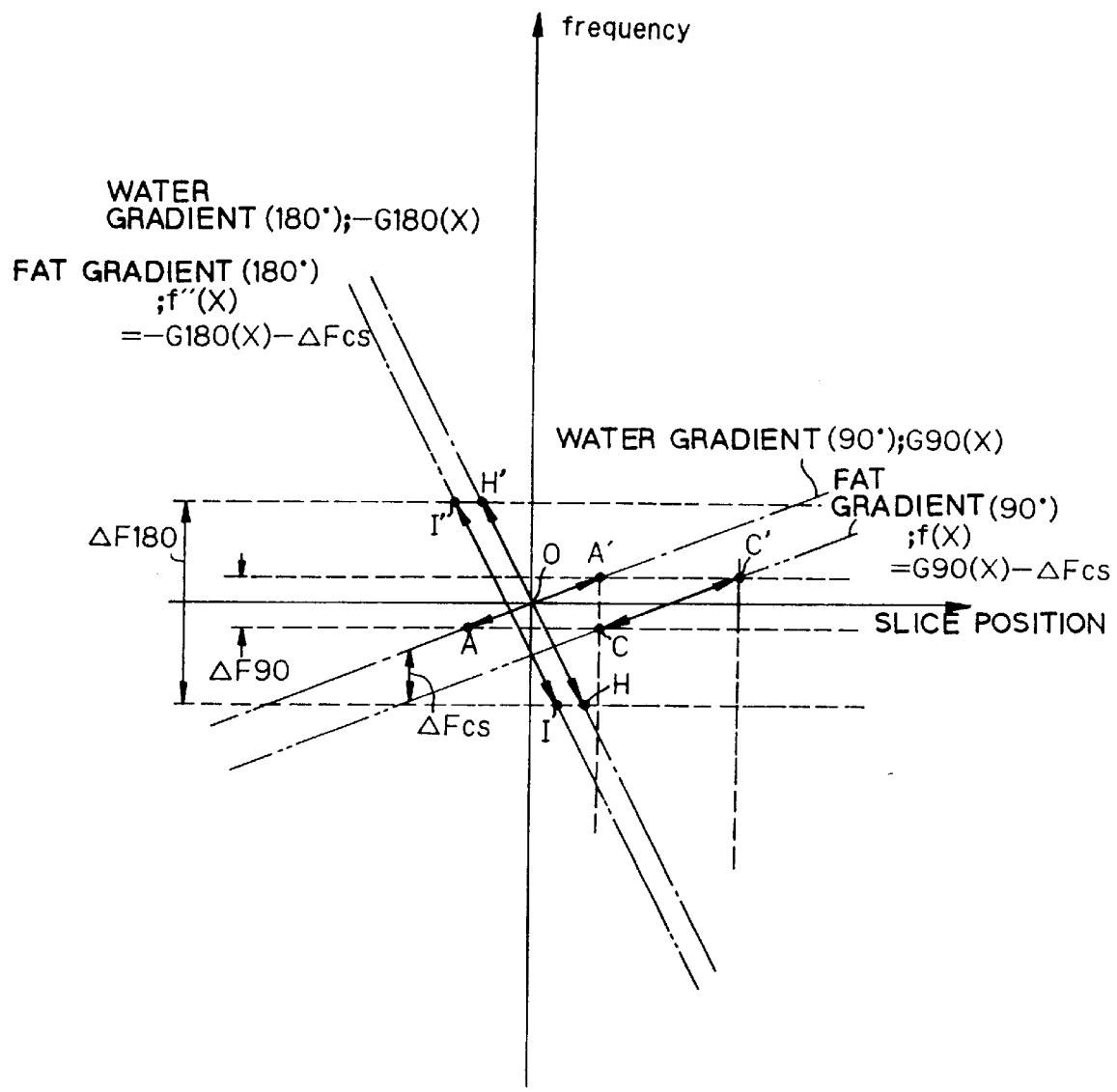
FIG. 24 is a diagram for explaining a difference in slice position between water and fat in PASTA.

When a 180° RF refocusing pulse is applied in the presence of the second magnetic field gradient G180 of opposite polarity, water spins on a slice of slice position H–H' in FIG. 24 (FIG. 25C) are inverted 180°, and fat spins on a slice of slice position I–I' in FIG. 24 (FIG. 25D) are inverted 180° due to chemical shifts.

To be more specific, as shown in FIG. 24, since the slice H–H' is contained in the slice A–A', water spins on the slice H–H' are inverted from the X' axis to an −X' axis. Echoes are then induced as a result of refocusing. By contrast, the slice I–I' does not overlap the slice C–C' from a positional viewpoint. Fat spins on the slice I–I' do not undergo the influence of the 90° RF pulse but are merely inverted from a Z' axis to a −Z' axis by the 180° RF pulse. In other words, the fat spins do not have components that are rotational about the X' and Y' axes and are therefore not detected in the form of echoes by the RF coil 7 located parallel to the XY plane. Fat spins on the slice C–C' merely undergo the influence of the 90° RF pulse but do not undergo the influence of the 180° RF pulse. After flipping onto the X axis, as shown in FIG. 25E, the fat spins are merely dispersing around the X' axis but do not induce echoes. Consequently, almost all echoes to be acquired are echoes induced by the water on the slice A–A'. Thus, mixing of echoes induced by the fat can be suppressed efficiently.

For PASTA, frequency-selective excitation of water can be effected properly without shimming the static field, and effective fat suppression can be achieved.

Next, the overall operations of this embodiment will be described with reference to FIGS. 26 to 31.

Figure 26:
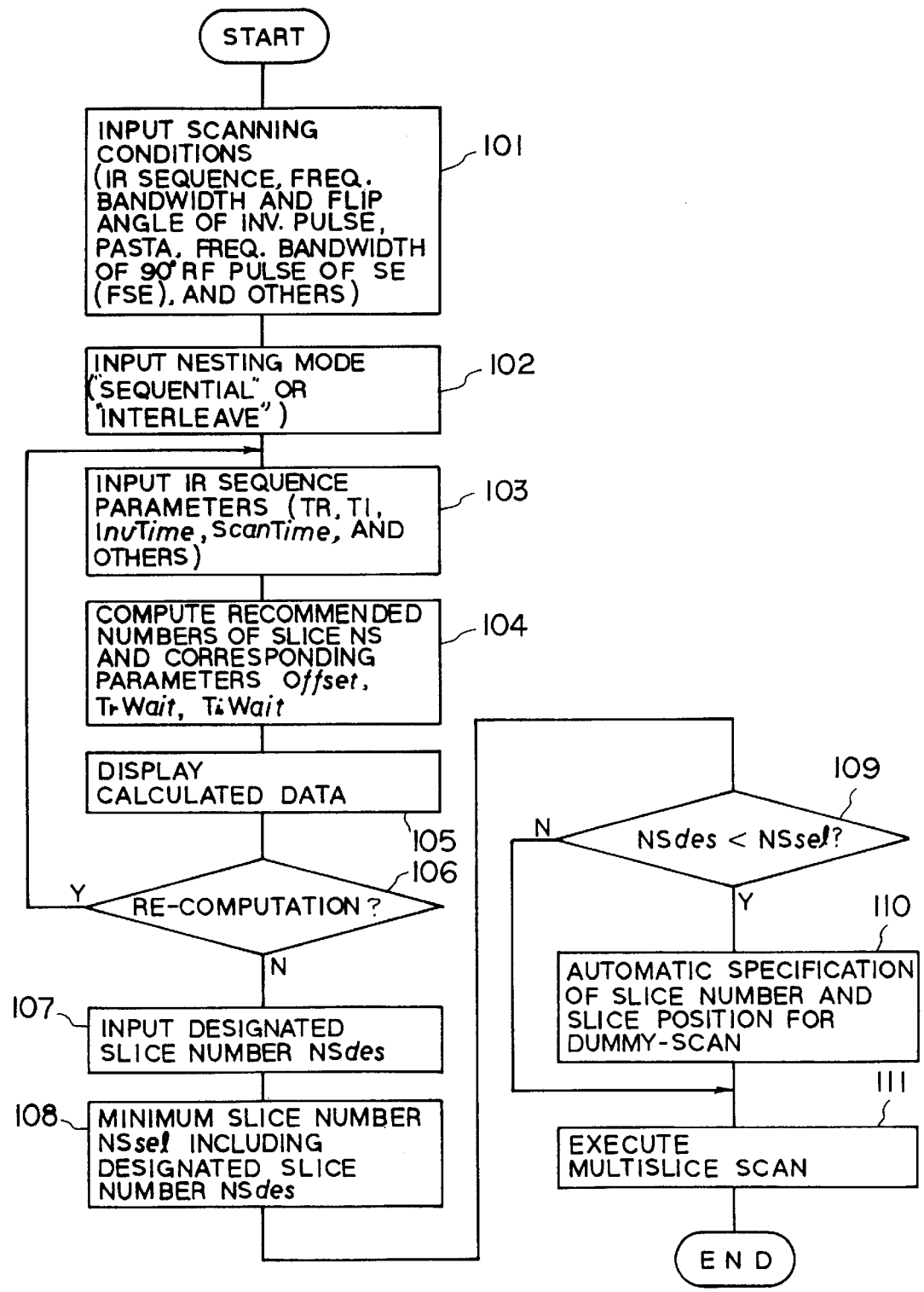
FIG. 26 is a brief flowchart describing an example of making preparations for scanning in the second embodiment.

The controller 6 executes the processing, which is described in FIG. 26, concerning multislice scan. First, at step 101 in FIG. 26, the controller 6 inputs scanning conditions entered by an operator at the input unit 13. The scanning conditions include an IR pulse sequence, a frequency bandwidth (wide, normal, narrow) of an inversion pulse included in the pulse sequence, a flip angle to be produced by the inversion pulse, and whether or not PASTA is implemented. If the FLAIR or fast FLAIR is specified, a frequency bandwidth (wide, normal, narrow) of a 90° RF pulse of SE or FSE imaging sequence is also specified. The influences of the wide frequency bandwidth, a flip angle, and whether or not PASTA is implemented upon an MR image have been described previously. These parameters are designated by the operator in consideration of the intended features of an MR image.

Control is then passed to step 102. The controller inputs designate information concerning nesting for a multislice scan through the input unit 13. As for the nesting, as mentioned above, the "sequential mode" (See FIGS. 11 and 12A, 12B) and "interleave mode" (FIGS. 13 and 14A, 14B) are available. Based on this input information, either of the nesting modes is determined.

Figure 27:
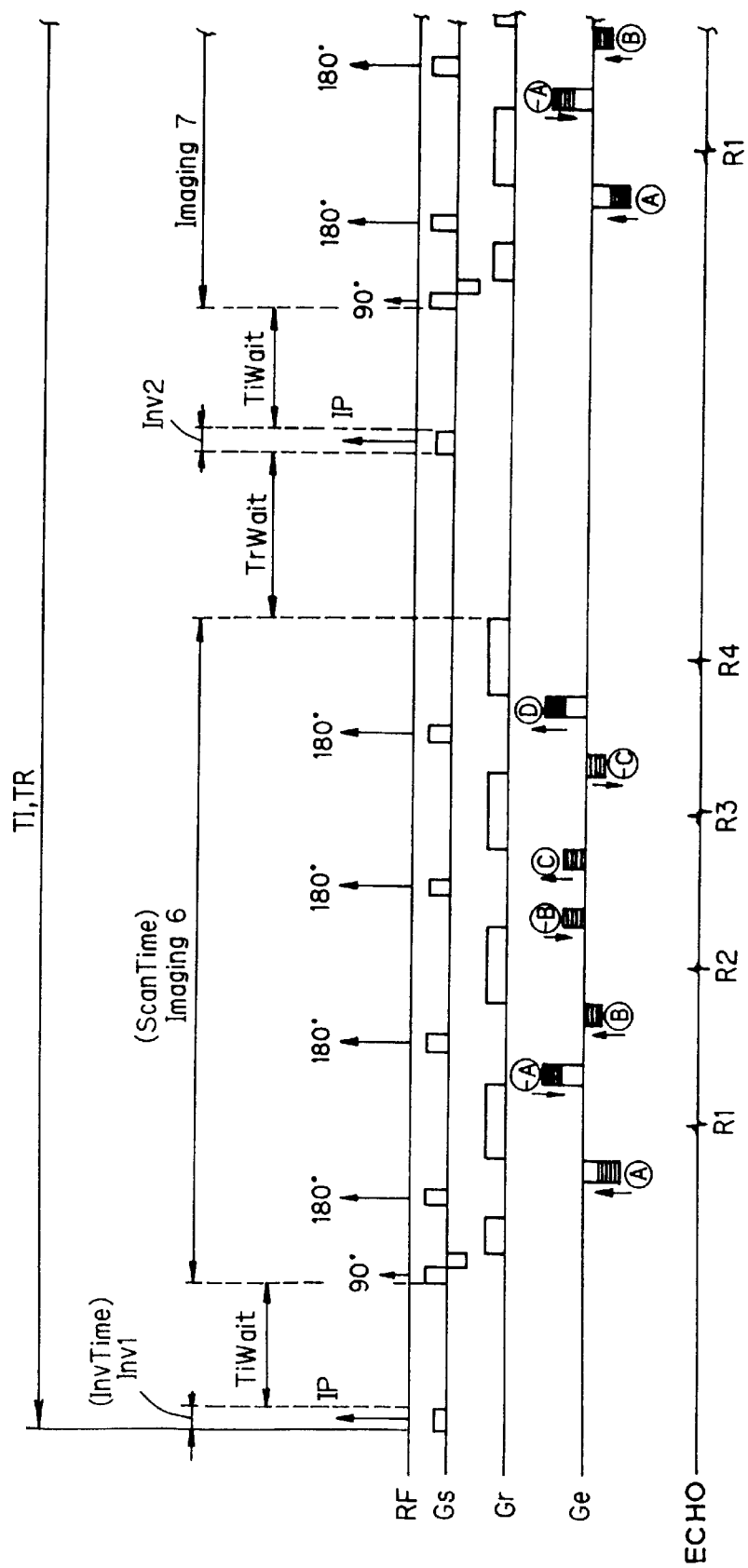
FIG. 27 is a timing chart showing part of a detailed example of fast FLAIR.

At step 103, parameters concerning the designated IR pulse sequence are input from the input unit 13. The parameters include, for example, as shown in FIG. 27 (which illustrating fast FLAIR), a repetition time TR, an inversion time TI, a duration of an inversion sequence InvTime, and a duration of an imaging sequence (for example, FSE) ScanTime.

As for the repetition time TR and inversion time TI, the operation can designate any times. In many cases, therefore, a clear-cut value such as 8000 msec for TR or 2000 msec for TI can be designated.

After the inputting of steps 101 to 103 is completed, the controller 6 passes control to steps 104 and 105 sequentially. At step 104, list data including recommended values of the number of slices NS, the number of offsets Offset to be paired with the number of slices NS, and adjustment times TrWait and TiWait is computed on the basis of the input data of the TR, TI, InvTime, and ScanTime values according to the aforesaid expressions (1) and (2). At step 105, the list data are displayed as a list, which is recommended to the operator by the system, on the display unit 12. An example of the display is shown in FIG. 28.

The controller then waits for a response from the operator at step 106. When the operator cannot find a pair of desired numbers of slices and offsets in the recommended-value list and wants to vary the parameter values for re-computation (judged in the negative at step 106), control is returned to step 103. By contrast, when the recommended-value list contains a pair of desired numbers of slices and offsets (judged in the affirmative at step 106), control is passed to step 107.

At step 107, the number of slices Nsdes designated by the operator is input, as shown in FIG. 29. Thereafter, at step 108, a minimum number of slices NSsel including the desired number of slices NSdes (a maximum number of slices for the designated number of offset paired with the desired number of slices) is selected from pairs of data in the recommended-value list.

At step 109, it is judged whether the NSdes value is smaller than the NSsel value. If the judgment is made in the negative, the NSdel value is equal to the NSsel value. That is to say, the number of slices NSdes desired by the operator agrees with the number of slices in the recommended-value list. In this case, the processing of step 110 is skipped.

On the contrary, if the judgment is made in the affirmative at step 109, the recommended number of slices NSsel determined automatically by the system is larger than the number of slices NSdes desired by the operator. For example, the operator desires 15 as the NSdes value, while the NSsel value automatically specified by the system is 17.

In this case, the controller 6 performs the processing of step 110. Assuming that the NSdes value is 15 and the NSsel value is 17, the NSsel value is larger by 2. The two excessive slices are then specified as slices to be subjected to dummy shoot. The number and positions of slices subjected to dummy shoot are determined automatically by the controller 6 according to a setting mode stored in advance. The setting mode includes (i) a mode in which dummy-scan slices are set at both ends in a slice direction, (ii) a mode in which dummy-scan slices are set at one end in a slice direction, and (iii) a mode in which when the number of dummy-scan slices is one, the slice is set on one predetermined end in a slice direction. Alternatively, it is possible to allow an operator to designate any setting mode every time.

When preparations for scanning are thus completed, multislice scan is executed according to the designated IR pulse sequence at step 111. For the scan, the scanning conditions, nesting mode, sequence parameters, and dummy-scan slices (if necessary), which have been designated through the aforesaid processing, are fetched.

Assuming that "fast FLAIR" is designated together with "sequential" nesting, a practical example of a nested pulse sequence will be described in conjunction with FIGS. 11, 12A, 12B and 27. The sequences constituting the nested pulse sequence are made mutually successive by the gradient sequencer 5a and RF sequencer 5b.

First, an inversion sequence Inv1 is applied to slice 1. The inversion sequence Inv1 is composed of, for example, an inversion pulse IP that is a 180° RF pulse, and a slice-selective magnetic field gradient $G_S$. The inversion pulse and magnetic field gradient are applied in parallel. The inversion pulse Inv1 is applied by the transmitter 8T via the RF coil 7, while the slice-selective magnetic field gradient $G_S$ is applied by the gradient power supply 4 via the gradient coils 3a.

The frequency bandwidth of the inversion pulse IP is set to a wide bandwidth or narrow bandwidth according to input information entered by an operator, and/or a flip angle to be produced by the inversion pulse IP is automatically set to 180° or a value smaller than 180°. The same applies to the other inversion pulses. The waveform of the slice-selective magnetic field gradient Gs is defined so that the magnetic field gradient can selectively excite slice 1.

When the inversion sequence Inv1 comes to an end, a standby state is established to permit the passage of an automatically-computed first adjustment time TiWait. After the standby state is lifted, an imaging sequence Imaging6 is initiated for slice 6, which has been inverted during the previous repetition time TR, using an FSE pulse sequence.

Specifically, as shown in FIG. 27, a 90° RF pulse is applied together with a slice-selective magnetic field gradient Gs initially. Consequently, slice 6 of a patient body is selected, and spins of protons on the slice plane are excited and flipped onto a y' axis (rotational coordinates). According to the imaging sequence, a slice-selective magnetic field gradient Gs is then inverted. Thereafter, a readout magnetic field gradient Gr is applied via the gradient coils 3x. This is intended to phase spins arranged in the Gr direction on the slice at time instants coincident with the middles of productions of echoes.

A first 180° RF pulse is then applied together with a slice-selective magnetic field gradient Gs. This causes the spins of protons to rotate 180° about the y' axis. Moreover, after a first phase-encoding magnetic field gradient Ge (=A) is applied to the patient P by the gradient power supply 4 via the gradient coils 3y, a first spin echo R1 is acquired via the RF coil 7 along with the application of a readout magnetic field gradient Gr via the gradient coils 3x.

Thereafter, a phase-encoding magnetic field gradient Ge (=−A) of opposite polarity is applied. This is intended to return an encoding position to a center position (ke=0) in a phase-encoding direction in a k-space on application of a 180° RF pulse and to eventually avoid deterioration of image quality due to stimulated echoes.

A second 180° RF pulse is then applied together with a slice-selective magnetic field gradient Gs. Thereafter, a second phase-encoding magnetic field gradient Ge (=B) is applied. A second spin echo R2 is then acquired via the RF coil 7 along with the application of a readout magnetic field gradient Gr.

In the foregoing imaging sequence, when PASTA is commanded for the purpose of fat suppression through the processing of FIG. 26 described previously, a 90° RF exciting pulse that is not shown in FIG. 27 is set to a narrow bandwidth. Moreover, the strengths and polarities of slice-selective magnetic field gradients Gs90 and Gs100 which are applied in parallel with a 90° RF exciting pulse and 180° RF refocusing pulse, respectively, are adjusted as mentioned previously.

After imaging sequence 6 is thus initiated for slice 6, a standby state is established to permit the passage of a second adjustment time TrWait. After the standby state is lifted, an inversion pulse IP is applied to slice 2 together with a slice-selective magnetic field gradient Gs. The size of the waveform of the magnetic field Gs is determined so that the magnetic field can selectively excite slice 2 adjoining the slice 1.

After the inversion sequence Inv2 comes to an end, a standby state is established to permit the passage of the first adjustment time TiWait. An imaging sequence Imaging7 is then initiated for slice 7 that has been inverted during the previous repetition time TR.

The above processing is repeated hereafter. The protons on seven slices 1 to 7 shown in FIGS. 12A and B are therefore inverted orderly at regular intervals of ta. Imaging is also executed orderly for the slices at regular intervals of tb.

These kinds of processing are repeatedly executed for the seven slices at intervals of a certain repetition time TR.

Echoes produced by multislice scanning and acquired as mentioned above are sent consecutively to the receiver 8R. After being subjected to such processing as amplification, intermediate-frequency transformation, phase detection, and low-frequency amplification, the echoes are converted into a digital form and thus recomposed into echo data. The echo data is mapped into a memory area corresponding to a k-space, in which a Fourier transform can be performed, by the arithmetic unit 10. Two-dimensional Fourier transform is then performed to reconstruct an image in a real space. This image is stored in the memory unit 13 and displayed on the display unit 14.

When "interleave"-mode nesting is designated, the protons on seven slices 1 to 7 shown in FIG. 14A are inverted every other slice as shown in FIG. 14B. Imaging is also executed for every other slice. Unlike the "sequential" mode, inversion and signal acquisition are performed on every other slice. An idle time from inversion occurring on one slice to that occurring on an adjoining one is a constant time ta' (>ta)(FIG. 12B). An idle time from imaging of one slice to that of an adjoining one is a constant time tb' (>tb)(FIG. 12B). These times are larger than those in the "sequential" mode.

In diagnosis, two kinds of scanning are performed for obtaining two kinds of images and comparatively interpreting those images. One scan is carried out by setting the frequency bandwidth of the inversion pulse to a wider or narrower bandwidth than the normally-used bandwidth to have the greater MT or appropriate RMT effect, while the other scan is carried out using the conventionally (normally)-used bandwidth of the inversion pulse.

According to this embodiment, the advantages described below are provided.

Figure 30:
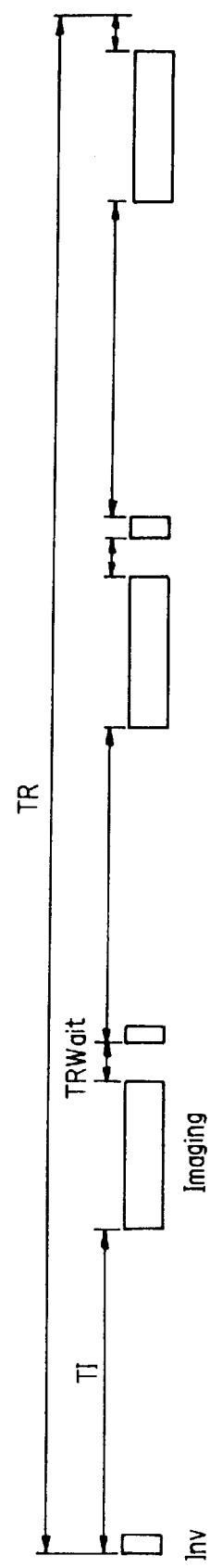
FIG. 30 is a diagram showing an example of a known IR pulse sequence in comparison with that of the second embodiment.
Figure 31:
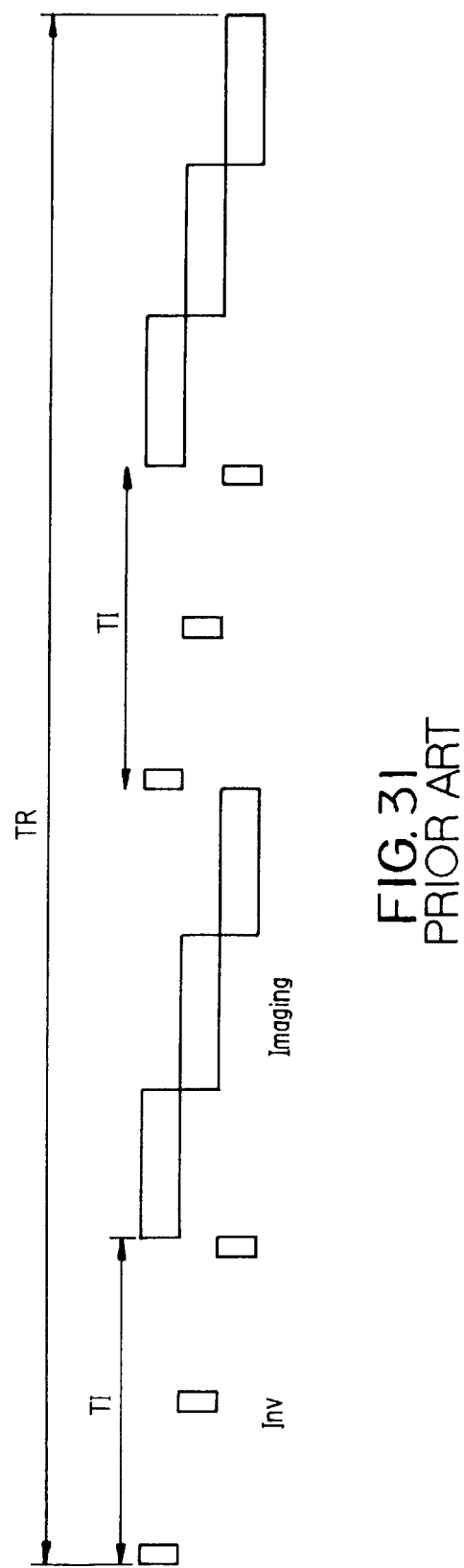
FIG. 31 is a diagram showing another example of a known IR pulse sequence in comparison with that of the second embodiment.

To begin with, the advantages of the aforesaid nesting will be described in relation to a known IR pulse sequence employed in multislice scanning. FIG. 30 shows a known normal pulse sequence (that is not a nested pulse sequence), wherein a pair of an inversion sequence and imaging sequence is repeated after each passage of one adjustment time TrWait during a certain repetition time TR. FIG. 31 shows an example of a known nested pulse sequence. However, the number of slices in the example of FIG. 30 is small. In the example of FIG. 31, pulse sequences to be applied to adjoining slices are applied irregularly. This results in irregular sensitivity between slices.

However, according to this embodiment, in either of the sequential and interleave nesting modes, the cycles of inversion pulses to be applied to adjoining slices, ta and ta', are set to the longest possible times. The influence of the MT effect (or RMT effect) exerted by an inversion pulse to be applied to a certain slice upon an adjoining slice can be reduced to the greatest extent. The effect of reduction becomes outstanding, especially, in interleave mode. In addition, the influence of the MT effect (or RMT effect) is made uniform among all slices. Irregular sensitivity between slices attributable to the effect hardly occurs. Stable image quality can be ensured.

One proposal has been made for nesting employed in fast FLAIR by J. Listerud et al. (Refer to "Optimized Interleaved Fluid Attenuation with Inversion Recovery (OIL FLAIR)" #643 SMR '95 abstract). However, when this known nesting is adopted, an operator cannot set a repetition time TR to any value. Moreover, the repetition time TR is provided as a result of combining pulse sequences. The repetition time TR therefore assumes an odd value. The freedom of setting the repetition time is very low. Many restrictions are imposed on use of the known nesting. Furthermore, no consideration is taken into the aforesaid MT or RMT effect. Pulse sequences are nested with the effects ignored.

By contrast, when the nesting of this embodiment is adopted, an operator can initially set a repetition time TR and inversion time TI to any value. In many cases, clear-cut times can therefore be set; such as, 8000 msec. for TR and 2000 msec. for TI. The freedom of setting the times is high. Furthermore, the MT or RMT effect is made uniform at the lowest level among slices. Irregular sensitivity can therefore be eliminated.

Moreover, a maximum number of slices can be set in a state in which the high freedom of setting times, improved sensitivity between slices, and uniform effect are attained under given conditions. Supposing an operator desires the maximum number of slices, the same number of slices are scanned. However, when the number of slices desired by the operator is smaller than the maximum number of slices, positions of excessive slices are determined automatically, and dummy scan is designated. For example, in FIG. 12A or 14A, an operator designates five slices, though up to seven slices 1 to 7 can be scanned (the number of offsets Offset=2). In this case, dummy shoot is commanded relative to slices 1 and 7 on both ends. When dummy shoot is executed, the MT or RMT effect, which has no relation to image reconstruction, is actually exerted on the slices 1 and 7. The influence of chemical exchange and/or cross relaxation of spins upon an adjoining slice 2 or 6 becomes substantially identical to that upon any other one of slices 3 to 5. Consequently, irregular sensitivity between slices can be retained at the lowest possible constant level.

According to this embodiment, the MT or RMT effect is utilized actively if necessary. The contrast, for example, between the white matter and gray matter in the head or between the parenchyma and the basal ganglia of the corpus callosum can therefore be improved. An unprecedented MR image that is helpful for diagnosis can be produced. Furthermore, when a flip angle to be produced by an inversion pulse is made smaller than 180° if necessary, a null point concerning a CSF signal can be shifted toward a shorter TI and eventually a repetition time TR can be shortened. Moreover, when the frequency bandwidth of an inversion pulse is set to a wide bandwidth or narrow bandwidth if necessary, a "short TI" can be specified actively. Consequently, a T1-weighted image can be produced. Furthermore, PASTA can be executed according to an IR SE pulse sequence or FSE pulse sequence if necessary. In this case, the effect of fat suppression can be yielded in addition to the aforesaid various effects.

Incidentally, the nested pulse sequence, wide or narrow frequency bandwidth of an inversion pulse, setting of a flip angle to be produced by the inversion pulse (<180°), and implementation of PASTA may be effected independently or effected in pairs or in groups. The invention can also be practiced into a single-slice scan. The imaging sequence of the invention may be an EPI (FE- or SE-system) sequence.

What is claimed is:

1. A method of magnetic resonance imaging for a plurality of slice planes of an object by carrying out a plurality of pulse sequences at a repetition time, each pulse sequence being applied to each slice plane and including an inversion sequence with an inversion pulse and an imaging sequence applied after an inversion time has passed from the application of the inversion sequence, and each slice including nuclear spins, the method comprising the steps of:

manually specifying both the repetition time and the inversion time;

setting the plurality of pulse sequences according to both of the specified repetition time and the specified inversion time so that, during each inversion time of each specified pulse sequence, both of more than one inversion sequence and more than one imaging sequence belonging to pulse sequences other than the specified pulse sequence is allocated in a nesting way that allows the plurality of pulse sequences to be nested one in another during repeating a scan every repetition time, and the plurality of pulse sequences cause the nuclear spins included in each of the plurality of slice planes to be subjected to magnetic actions during the same time interval within the repetition time by allocating two kinds of waiting time periods between the applications of the inversion sequence and the imaging sequence; and performing a multislice scan for the plurality of slice planes using the set pulse sequences.

2. The method of claim 1, wherein the two kinds of waiting time periods are allocated before and after each of the plurality of imaging sequences, respectively.

3. The method of claim 1, further comprising the steps of:

displaying a list of pairs indicating both the number of offset slice planes corresponding to the number of nested slice planes to be scanned during the inversion time and a maximum number of slice planes according to the number of offset slice planes;

first specifying by hand a desired number of plural slice planes;

selecting, from the displayed list, a certain maximum number of slice planes including the desired number of slice planes, but the selected maximum number of slice planes being a minimum in the list of the displayed maximum number of slice planes;

determining whether the number of the selected maximum number of slice planes is equal to the desired number of slice planes; and second specifying, as a dummy-scan slice plane, more than one surplus slice planes among the plurality of slice planes according to the selected maximum number of slices when the selected maximum number of slice planes is over the desired number of slice planes.

4. The method of claim 1, wherein the nesting way is either a sequential-mode nesting with which an order of the plural slice planes to be subjected to the scan is consecutive or an interleave-mode nesting with which an order of the plural slice planes to be subjected to the scan is alternate.

5. The method of claim 1, wherein each of the plurality of pulse sequences is one selected from a group consisting of a slice-selective inversion pulse combined with an FE pulse sequence, a slice-selective inversion pulse combined with a fast FE pulse sequence, a slice-selective inversion pulse combined with an SE pulse sequence, a slice-selective inversion pulse combined with a fast SE pulse sequence, and a slice-selective inversion pulse combined with an echo planar imaging sequence.

6. A magnetic resonance imaging system for a plurality of slice planes of an object by carrying out a plurality of pulse sequences at a repetition time, each pulse sequence being applied to each slice plane and including an inversion sequence with an inversion pulse and an imaging sequence applied after an inversion time has passed from the application of the inversion sequence, and each slice including nuclear spins, the system comprising:

a unit configured to receive both manually specified repetition time and inversion time;

a setting unit configured to specify the plurality of pulse sequences according to both of the specified repetition time and the specified inversion time, wherein the setting unit comprises first allocating means for allocating, during each inversion time of each specified pulse sequence, both of more than one inversion sequence and more than one imaging sequence belonging to pulse sequences other than the specified pulse sequence in a nesting way that allows the plurality of pulse sequences to be nested one in another during repeating a scan every repetition time, and second allocating means for allocating two kinds of waiting time periods between the applications of the inversion sequence and the imaging sequence so that the plurality of pulse sequences cause the nuclear spins included in each of the plurality of slice planes to be subjected to magnetic actions during the same time interval within the repetition time; and a performing unit configured to perform a multislice scan for the plurality of slice planes using the set pulse sequences.

7. The system of claim 6, wherein the second allocating means is configured to allocate the two kinds of waiting time periods before and after each of the plurality of imaging sequences, respectively.

8. The system of claim 6, further comprising:

a displaying unit configured to display a list of pairs indicating both the number of offset slice planes corresponding to the number of nested slice planes to be scanned during the inversion time and a maximum number of slice planes according to the number of offset slice planes;

a first specifying unit configured to specify by hand a desired number of plural slice planes;

a selecting unit configured to select, from the displayed list, a certain maximum number of slice planes including the desired number of slice planes, but the selected maximum number of slice planes being a minimum in the list of the displayed maximum number of slice planes;

a determining unit configured to determine whether the number of the selected maximum number of slice planes is equal to the desired number of slice planes; and a second specifying unit configured to specify, as a dummy-scan slice plane, more than one surplus slice planes among the plurality of slice planes according to the selected maximum number of slices when the selected maximum number of slice planes is over the desired number of slice planes.

9. The system of claim 6, wherein the first allocating means is configured to allocate the nesting way is either a sequential-mode nesting with which an order of the plural slice planes to be subjected to the scan is consecutive or an interleave-mode nesting with which an order of the plural slice planes to be subjected to the scan is alternate.

10. The system of claim 6, wherein each of the plurality of pulse sequences is one selected from a group consisting of a slice-selective inversion pulse combined with an FE pulse sequence, a slice-selective inversion pulse combined with a fast FE pulse sequence, a slice-selective inversion pulse combined with an SE pulse sequence, a slice-selective inversion pulse combined with a fast SE pulse sequence, and a slice-selective inversion pulse combined with an echo planar imaging sequence.

* * * * *